US011431936B2

(12) United States Patent
Fan et al.

(10) Patent No.: US 11,431,936 B2
(45) Date of Patent: Aug. 30, 2022

(54) IMAGE SENSOR WITH SHARED GRAY CODE GENERATOR AND PARALLEL COLUMN ARITHMETIC LOGIC UNITS

(71) Applicant: OMNIVISION TECHNOLOGIES, INC., Santa Clara, CA (US)

(72) Inventors: Lihang Fan, Sunnyvale, CA (US); Min Qu, Mountain View, CA (US); Yu-Shen Yang, San Jose, CA (US); Charles Qingle Wu, Palo Alto, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 312 days.

(21) Appl. No.: 16/854,765

(22) Filed: Apr. 21, 2020

(65) Prior Publication Data
US 2021/0329185 A1    Oct. 21, 2021

(51) Int. Cl.
| | |
|---|---|
| *H03M 1/12* | (2006.01) |
| *H04N 5/378* | (2011.01) |
| *H03M 7/16* | (2006.01) |
| *H03M 1/56* | (2006.01) |
| *H03K 19/21* | (2006.01) |
| *H03K 19/20* | (2006.01) |

(52) U.S. Cl.
CPC .............. *H04N 5/378* (2013.01); *H03M 1/56* (2013.01); *H03M 7/16* (2013.01); *H03K 19/20* (2013.01); *H03K 19/21* (2013.01)

(58) Field of Classification Search
CPC .......... H03M 1/56; H03M 7/16; H04N 5/378; H03K 19/20; H03K 19/21
USPC ........................................................ 341/155
See application file for complete search history.

(56) References Cited

U.S. PATENT DOCUMENTS

2020/0404246 A1*    12/2020    Beshinski ............. G01S 7/4914

* cited by examiner

*Primary Examiner* — Peguy Jean Pierre
(74) *Attorney, Agent, or Firm* — Perkins Coie LLP

(57) ABSTRACT

A readout circuit for use in an image sensor includes a plurality of comparators. Each one of the plurality of comparators is coupled to receive a ramp signal and a respective analog image data signal from a respective one of a plurality of column bit lines to generate a respective comparator output. Each one of a plurality of arithmetic logic units (ALUs) is coupled to receive phase-aligned Gray code (GC) outputs generated by a GC generator. Each one of the plurality of ALUs is further coupled to a respective one of the plurality of comparators to receive the respective comparator output. Each one of the plurality of ALUs is coupled to latch the phase-aligned GC outputs in response to the respective comparator output to generate a respective digital image data signal.

41 Claims, 12 Drawing Sheets

IMAGE SENSOR WITH SHARED GRAY CODE GENERATOR AND PARALLEL COLUMN ARITHMETIC LOGIC UNITS

BACKGROUND INFORMATION

Field of the Disclosure

This disclosure relates generally to image sensors, and in particular but not exclusively, relates to image sensors that include readout circuitry.

Background

Image sensors have become ubiquitous and are now widely used in digital cameras, cellular phones, security cameras, as well as, medical, automobile, and other applications. As image sensors are integrated into a broader range of electronic devices it is desirable to enhance their functionality, performance metrics, and the like in as many ways as possible (e.g., resolution, power consumption, dynamic range, etc.) through both device architecture design as well as image acquisition processing.

A typical image sensor operates in response to image light from an external scene being incident upon the image sensor. The image sensor includes an array of pixels having photosensitive elements (e.g., photodiodes) that absorb a portion of the incident image light and generate image charge upon absorption of the image light. The image charge photogenerated by the pixels may be measured as analog output image signals on column bit lines that vary as a function of the incident image light. In other words, the amount of image charge generated is proportional to the intensity of the image light, which is read out as analog signals from the column bit lines and converted to digital values to produce digital images (i.e., image data) representing the external scene.

The analog image signal on the bit line is normally fed into an analog to digital converter (ADC) for conversion to the digital image signal. A ramp type ADC is often used with image sensors to convert the analog image signal to the digital image signal. For a ramp type ADC, a counter starts to count when a ramp signal begins and is compared to the analog image signal. At the point when the ramp signal and the analog image signal are equal, the value of the counter is latched as digital representation of the analog image signal. To achieve higher resolution digital image signal outputs, the time resolution of the counter is increased. This requires that the clock frequency of the counter to be increased. However, as the frequencies of clock signals increase, and as the resolutions of image sensors increase, the power consumption of the counter increases as well. A conventional column based ripple counter has a very large current surge during the ADC period. This large instantaneous current surge averages to be a very large power average power draw during the timing for each row readout. Further, the power consumption is non-uniform and depends on the light intensity. This is not a suitable solution especially in high frame rate and/or large pixel count image sensors. In addition, the large current surge causes large voltage (IR) drops, further limiting the maximum ADC clocking speed.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
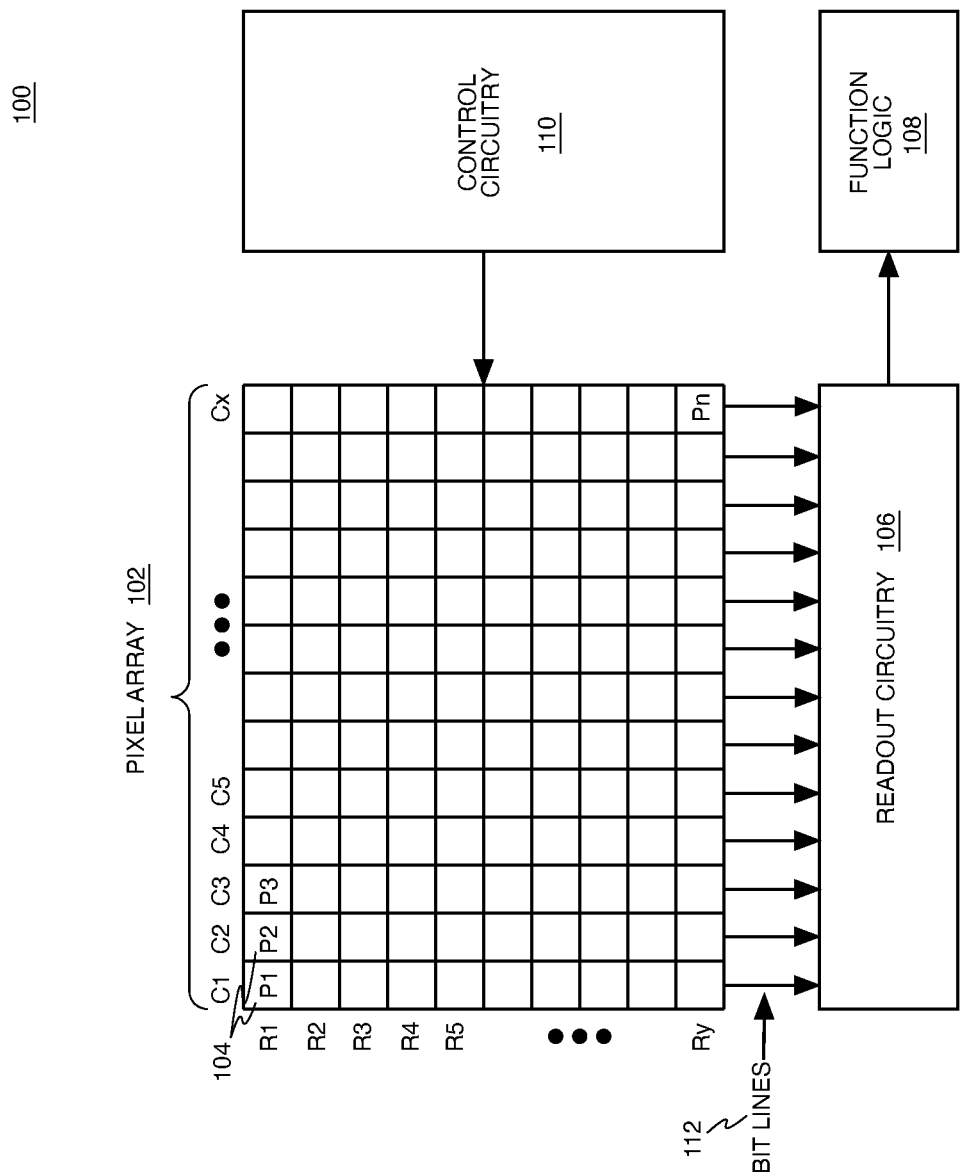
FIG. 1 illustrates one example of an imaging system including an image sensor with readout circuitry including a shared Gray code generator and parallel column arithmetic logic units in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. In addition, common but well-understood elements that are useful or necessary in a commercially feasible embodiment are often not depicted in order to facilitate a less obstructed view of these various embodiments of the present invention.

DETAILED DESCRIPTION

Various examples directed to reading out analog image signals from column bit lines in an image sensor with readout circuitry with column analog to digital conversion including a shared Gray code generator and parallel column arithmetic logic units are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "lower," "under," "above," "upper," "top," "bottom," "left," "right," "center," "middle," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein interpreted accordingly. In addition, it will also be understood that when a layer is referred to as being "between" two layers, it can be the only layer between the two layers, or one or more intervening layers may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be discussed, various examples of image sensor readout circuitry are disclosed in which analog image signals are read out in parallel from a pixel array through the column bit lines of an image sensor. In the various examples, each column bit line of the pixel array is coupled to one of the inputs of a respective comparator. The other input of each comparator is coupled to receive a global ramp signal. The output of each comparator is coupled to a respective column arithmetic logic unit (ALU) that is coupled to output digital or binary representations of the analog image signals from the pixel array. In various examples, the column ALUs are coupled to generate correlated double sampling (CDS) outputs, which are based on the difference between sampled and held signal (SHS) values and sampled and held reset (SHR) values of the image data that are read out from the pixel array. In the various examples, a shared Gray code (GC) generator is used to generate phase-aligned GC outputs that are coupled to be received by each of the column ALUs to perform parallel analog to digital conversion (ADC) of the image data read out from the column bit lines in accordance with teachings of the present invention.

To illustrate, FIG. 1 illustrates one example of an imaging system 100 including a pixel array 102 from which analog image signals are read out in parallel through column bit lines 112 to readout circuitry 106 in accordance with an embodiment of the present disclosure. As will be discussed in greater detail below, in various examples, readout circuitry 106 includes circuitry to perform analog to digital conversion (ADC) of the image data from pixel array 102 with parallel arithmetic logic units (ALUs) and a shared Gray code (GC) generator for correlated double sampling (CDS) in accordance with the teachings of the present invention.

In particular, the example depicted in FIG. 1 shows an imaging system 100 that includes pixel array 102, control circuitry 110, readout circuitry 106, and function logic 108. In one example, pixel array 102 is a two-dimensional (2D) array including a plurality of pixel circuits 104, which include photodiodes (e.g., P1, P2, . . . , Pn). As illustrated in the depicted example, the pixel circuits 104 are arranged into rows (e.g., R1 to Ry) and columns (e.g., C1 to Cx) to acquire image data of a person, place, object, etc., which can then be used to render an image of a person, place, object, etc.

In the example, each pixel circuit 104 is configured to photogenerate image charge in response to incident light. After each pixel circuit 104 has acquired its image charge, the corresponding analog image charge data is read out by readout circuitry 106 through column bit lines 112. In the various examples, the image charge from each row of pixel circuits 104 is read out in parallel through column bit lines 112 by readout circuitry. In the various examples, the analog image charge signals are converted to digital values, which are then transferred to function logic 106 in accordance with teachings of the present invention. In the various examples, the analog to digital conversion is performed with parallel ALUs and shared Gray code generator included in readout circuitry 106. In various examples, the readout circuitry 106 also performs correlated double sampling of the image data from pixel array 102. The function logic 108 may store the image data or even manipulate the image data by applying post image effects (e.g., crop, rotate, remove red eye, adjust brightness, adjust contrast, or otherwise).

Figure 2:
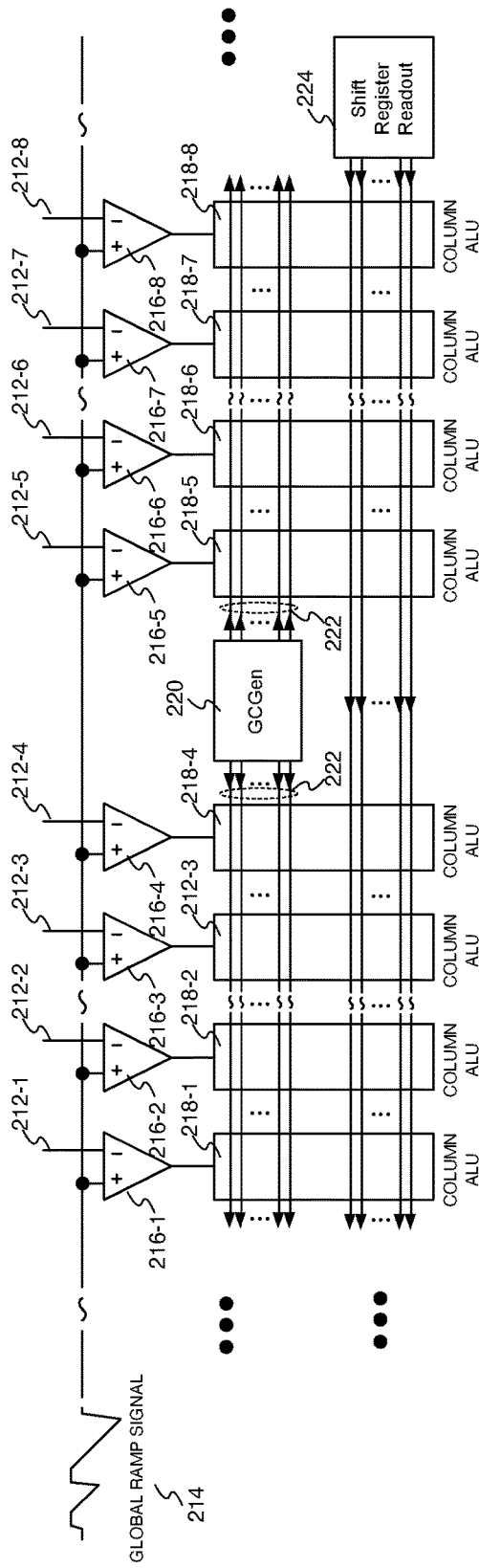
FIG. 2 illustrates a one example of a portion of readout circuitry including column analog to digital conversion with a shared Gray code generator and parallel column arithmetic logic units in accordance with the teachings of the present disclosure.

FIG. 2 illustrates a one example of a portion of readout circuitry 206 including column analog to digital conversion with a shared Gray code generator and parallel column arithmetic logic units (ALUs) in accordance with the teachings of the present disclosure. It is appreciated the readout circuitry 206 of FIG. 2 may be one example of the readout circuitry 106 of the image sensor 100 as shown in FIG. 1, and that similarly named and numbered elements described above are coupled and function similarly below.

As shown in the example depicted in FIG. 2, the portion of readout circuitry 206 includes a plurality of comparators 216. Each one of the plurality of comparators 216 is coupled to receive a ramp signal 214, which in one example is a global ramp signal. Each one of the plurality of comparators 216 is further coupled to a respective one of a plurality of column bit lines 212 from an image sensor to receive a respective analog image data signal from a column of the image sensor. As shown in the example, the outputs of the plurality of comparators 216 are coupled in parallel to respective column ALUs 218. Each one of the plurality of ALUs 218 is also coupled to receive phase-aligned Gray code (GC) outputs 222 that are generated by a shared Gray code (GC) generator 220 as shown. In one example, the phase-aligned GC outputs 222 that are generated by the GC generator 220 are 11-bit Gray code signals.

In operation, each one of the plurality of comparators 216 is coupled to generate a respective comparator output in response to a comparison of the respective analog image data signal received from the respective bit line 212 and the ramp signal. 214. In one example, when the voltage of the ramp signal 214 ramps down to a value equal to or less than the voltage of the analog image data signal carried by the respective column bit line 212, a falling edge occurs at the output of the respective comparator 216. In the example, each respective column ALU 218 is coupled to sample and hold, or latch, the 11-bit Gray code signal 222 received from the GC generator 220 when the falling edge occurs at the output of the respective comparator 216 that is coupled to the respective column ALU 218. As will be discussed, in the various examples, each column ALU 218 is then coupled to perform Gray code to binary code conversion on the latched phase-aligned GC code signal 222. In various examples, the column ALUs 218 may also be coupled perform correlated double sampling (CDS) operations in parallel on sampled and held reset (SHR) value samplings and sampled and held signal (SHS) samplings from the respective column bit lines 212 to generate normalized digital image signal data from the image sensor in accordance with the teachings of the present invention. In one example, the digital image signal data generated from the column ALUs 218 may then be output to respective global read bit lines of the readout circuitry 206.

In one example, the portion of readout circuitry 206 shown in FIG. 2 may be one of a plurality of portions of readout circuitry 206 that are repeated or "stitched together" across the columns of an image sensor array. In the example shown in FIG. 2, the image signal outputs from the column ALUs 218 may therefore be relayed from "right" to "left" through the column ALUs 218 of each portion of readout circuitry 206, and with shift register readouts 224 coupled to the first and last columns and interspersed between every N columns of the image sensor array, to readout out the image data from the image sensor array. For instance, in an example of a 48 megapixel sensor array, there are 8,000 columns. In the example, a single GC generator 220 is shared among each N=500 columns of the sensor array, such that a total of 16× portions of readout circuitry 206 shown in FIG. 2 are included between shift register readouts 224 coupled to the first and last columns and interspersed every 500 columns to readout the image signal outputs from the sensor array. In other words, shift readout registers 224 are coupled to respective ALUs 218 that are coupled to the first and last columns of the image sensor. In addition, shift registers are coupled to and are interspersed between the plurality of ALUs 218 of each one of the plurality of readout circuits 206 to readout the respective digital image data signals from the plurality of ALUs 218.

Figure 3:
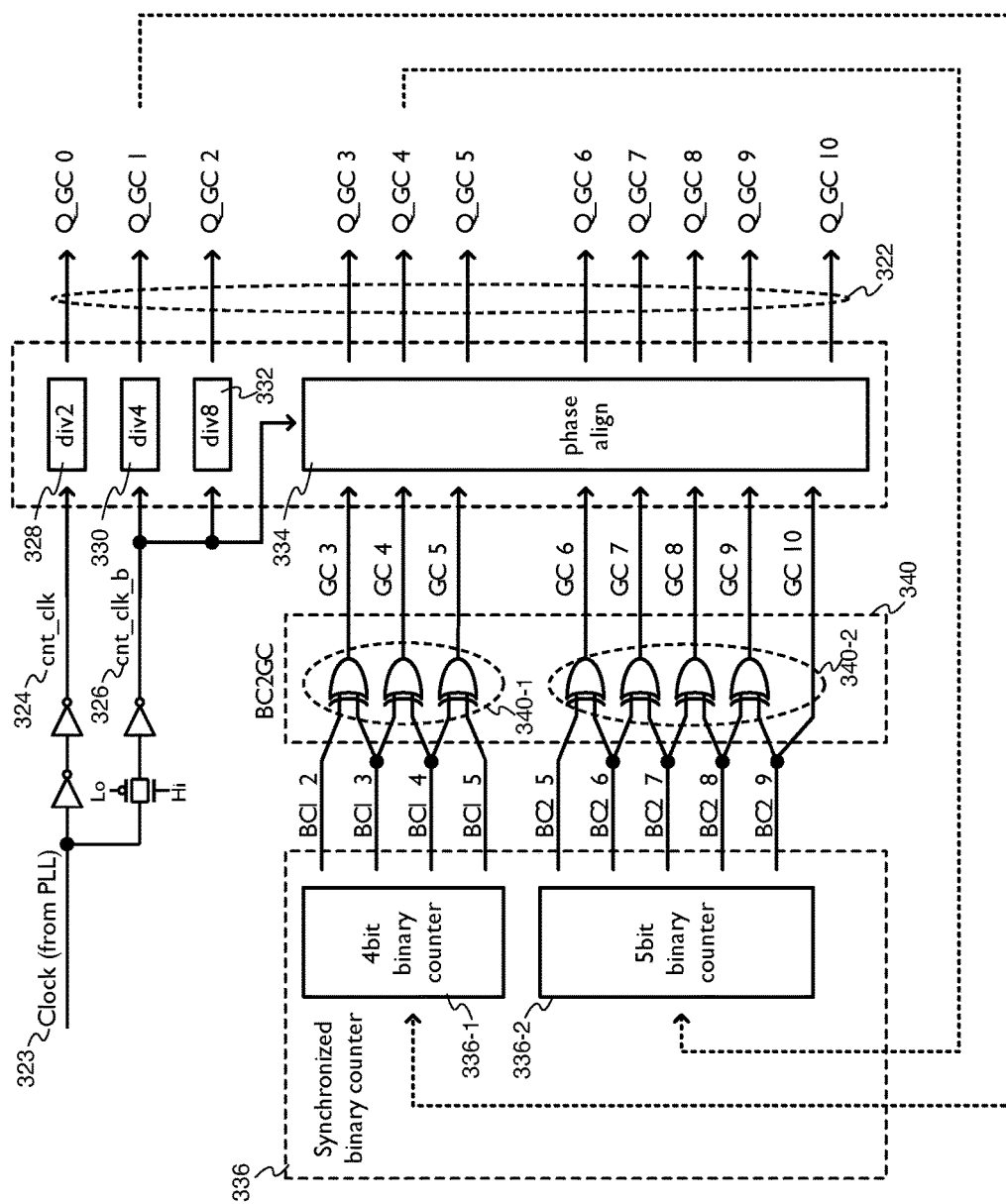
FIG. 3 illustrates a one example of a Gray code generator in accordance with the teachings of the present disclosure.

FIG. 3 illustrates a one example of a Gray code (GC) generator 320 in accordance with the teachings of the present disclosure. It is appreciated the GC generator 320 of FIG. 3 may be one example of GC generator 220 as shown in FIG. 2, and that similarly named and numbered elements described above are coupled and function similarly below. It is noted that the GC generator 320 is discussed in this disclosure generates 11-bit phase-aligned GC codes 322 for explanation purposes. It is appreciated that in other examples, a GC generator 320 may be expanded to include a greater number or a fewer number of Gray code bits in accordance with the teachings of the present invention.

In the examples described in this disclosure, the phases among GC codes 322 generated by GC generator 320 are well aligned to prevent code error. In a conventional Gray code generator, the $N^{th}$ bits needs to be divided by $2^{N+1}$ from a clock signal due to the nature of Gray code. As N increases, the division operation becomes a massively large division operation, which presents many challenges when generating the higher bits of a Gray code when requiring that all of the GC bits are aligned and in phase. For example, bit 10 of a Gray code needs to be divided by $2^{11}$ by the clock signal, which would translate into 2,048 D flip flops connected in series to achieve such a large division ratio. Although, higher bits could utilize lower bits as a clock source, the phases between the lower bits and the higher bits are very difficult to align if the clock sources that are utilized are not the same, thereby causing erroneous Gray codes being generated as a consequence.

In the example depicted in FIG. 3, however, example GC generator 320 generates phase-aligned Gray code (GC) outputs 322 by utilizing a synchronized binary counter 336 coupled to a binary to Gray code converter 340 coupled to phase shift and alignment circuitry, which includes divide circuits 328, 330, 332 and phase align circuit 334 as shown in accordance with the teachings of the present invention. In the illustrated example, the divide circuits 328, 330, and 332 generate lower GC bits Q_GC 0, Q_GC 1, and Q_GC 2 of phase-aligned GC bits 322 in response to a clock 323. In the example, since lower GC bits Q_GC 0, Q_GC 1, and Q_GC 2 of phase-aligned GC bits 322 are generated in response to the same clock 323, the phases of lower GC bits Q_GC 0, Q_GC 1, and Q_GC 2 are therefore well aligned. In one example, clock 323 is generated by a phase lock loop (PLL) circuit. In the example depicted in FIG. 3, a first clock signal cnt_clk 324 and a second clock signal cnt_clk_b 326 are generated in response to clock 323. As shown, first clock signal cnt_clk 324 is generated as an output of an even number of series coupled inverter circuits coupled to receive clock 323, while second clock signal cnt_clk_b 326 is generated as an output of an odd number of series coupled inverter circuits coupled to receive clock 323. The phases of cnt_clk 324 and cnt_clk_b 326 are aligned using delay matching. In particular, first clock signal cnt_clk 324 is generated as an output of two series coupled inverters and second clock signal cnt_clk_b 326 is generated as an output of one inverter and a transmission gate circuit. As such, first clock signal cnt_clk 324 and second clock signal cnt_clk_b 326 are complements or inverted versions of each other in the depicted example.

Continuing with the example depicted in FIG. 3, divide circuit 328 is a divide by 2 circuit and is coupled to generate the Q_GC 0 bit of the phase-aligned GC outputs 322 in response to the first clock signal cnt_clk 324. In one example, the divide by 2 circuit of divide circuit 328 may be implemented with a D flip flop. Divide circuit 330 is a divide by 4 circuit and is coupled to generate the Q_GC 1 bit of the phase-aligned GC outputs 322 in response to the second clock signal cnt_clk_b 326. In one example, the divide by 4 circuit of divide circuit 330 may be implemented with two series-coupled D flip flops. Divide circuit 332 is a divide by 8 circuit and is coupled to generate the Q_GC 2 bit of the phase-aligned GC outputs 322 in response to the second clock signal cnt_clk_b 326. In one example, the divide by 8 circuit of divide circuit 332 may be implemented with four series-coupled D flip flops.

As shown in the example depicted in FIG. 3, synchronized binary counter 336 includes a first binary counter 336-1 that is coupled to generate a first plurality of binary bits BC1 2, BC1 3, BC1 4, and BC1 5 in response to the Q_GC 1 bit of the phase-aligned GC outputs 322. The binary to Gray code converter 340 includes a first binary to GC converter 340-1 coupled to generate a plurality of intermediate GC bits, which include GC 3, GC 4, and GC 5 in response to the first plurality of binary bits BC1 2, BC1 3, BC1 4, and BC1 5 as shown. As will be described in greater detail below, the phase align circuit 334 is coupled to generate a plurality of phase aligned intermediate GC bits Q_GC 3, Q_GC 4, and Q_GC 5 of the phase-aligned GC outputs 322 in response to the plurality of intermediate GC bits GC 3, GC 4, and GC 5 and the clock 323 via second clock signal cnt_clk_b 326.

Continuing with the example depicted in FIG. 3, synchronized binary counter 336 includes a second binary counter 336-2 that is coupled to generate a second plurality of binary bits BC2 5, BC2 6, BC2 7, BC2 8, and BC2 9 in response to the Q_GC 4 bit of the phase-aligned GC outputs 322. The binary to Gray code converter 340 includes a second binary to GC converter 340-2 coupled to generate a plurality of upper GC bits, which include GC 6, GC 7, GC 8, GC 9, and GC 10 in response to the second plurality of binary bits BC2 5, BC2 6, BC2 7, BC2 8, and BC2 9 as shown. As will be described in greater detail below, the phase align circuit 334 is coupled to generate a plurality of phase aligned upper GC bits, which include Q_GC 6, Q_GC 7, Q_GC 8, Q_GC 9, and Q_GC 10 of the phase-aligned GC outputs 322 in response to the plurality of upper GC bits GC 6, GC 7, GC 8, GC 9, and GC 10 and the clock 323 via second clock signal cnt_clk_b 326.

Referring back to the synchronized binary counter 336, it is noted that in the depicted example the first binary counter 336-1 is a 4-bit binary counter and that the second binary counter 336-2 is a 5-bit binary counter. In the example, the most significant bit (MSB) BC1 5 of the first binary counter 336-1 is substantially the same or substantially equal to the least significant bit (LSB) BC2 5 of the second binary counter 336-2.

Referring to the binary to Gray code converter 340, it is noted that in the example depicted in FIG. 3, the first binary to GC converter 340-1 includes an XOR gate coupled to generate the GC 3 bit in response to the BC1 2 and BC1 3 bits from first binary counter 336-1, an XOR gate coupled to generate the GC 4 bit in response to the BC1 3 and BC1 4 bits from first binary counter 336-1, and an XOR gate coupled to generate the GC 5 bit in response to the BC1 4 and BC1 5 bits from first binary counter 336-1 as shown. Similarly, the second binary to GC converter 340-2 includes an XOR gate coupled to generate the GC 6 bit in response to the BC2 5 and BC2 6 bits from second binary counter 336-2, an XOR gate coupled to generate the GC 7 bit in response to the BC2 6 and BC2 7 bits from second binary counter 336-2, an XOR gate coupled to generate the GC 8 bit in response to the BC2 7 and BC2 8 bits from second binary counter 336-2, and an XOR gate coupled to generate the GC 9 bit in response to the BC2 8 and BC2 9 bits from second binary counter 336-2 as shown. In the example, the MSB bit GC 10 of the plurality of upper GC bits is substantially the same or substantially equal to the MSB bit BC2 9 bit from the second binary counter 336-2.

Figure 4:
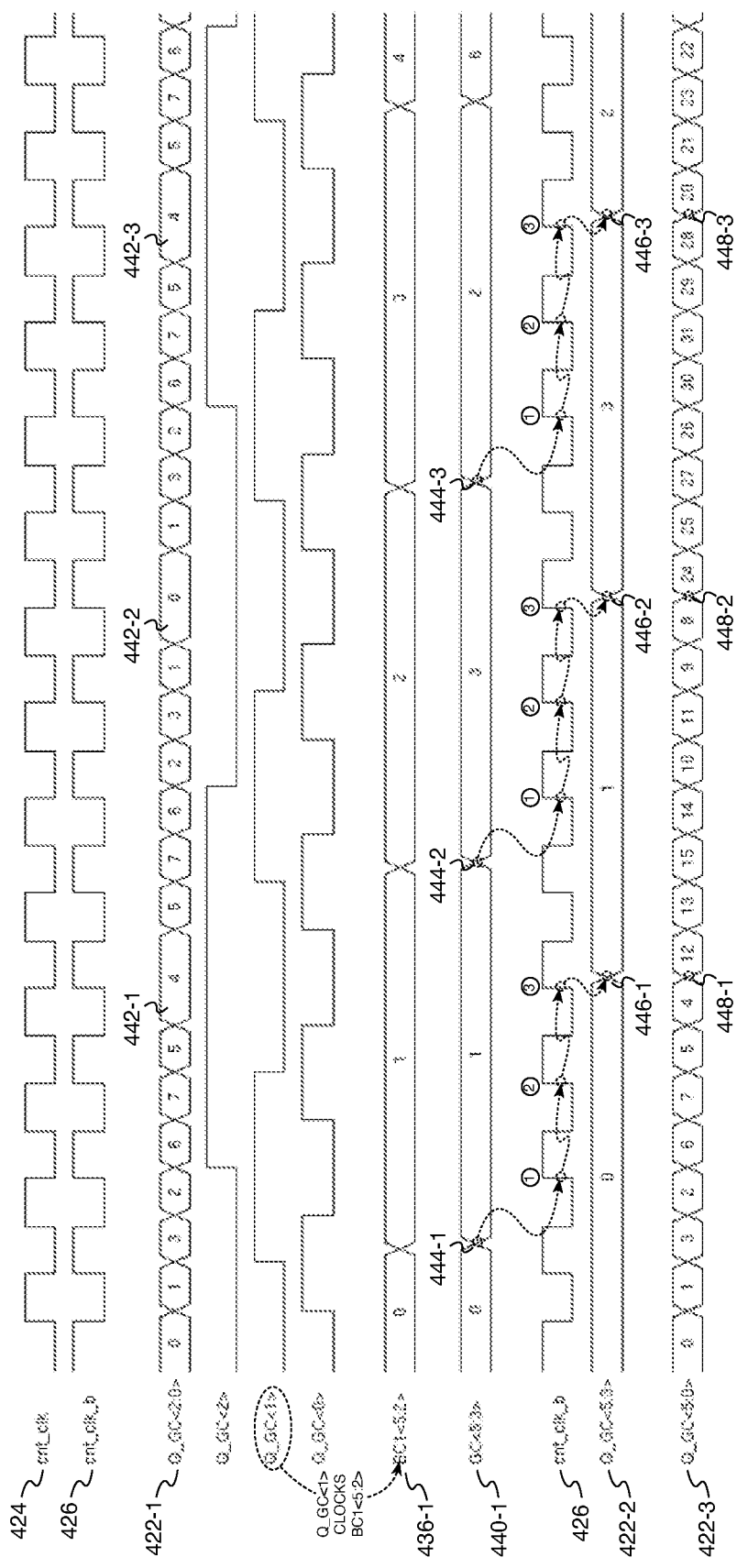
FIG. 4 shows example of timing diagrams illustrating the relative relationships between signals in a Gray code generator accordance with the teachings of the present invention.

FIG. 4 shows example of timing diagrams illustrating the relative relationships between signals in a Gray code generator accordance with the teachings of the present invention. It is appreciated the example signals illustrated in FIG. 4 may also be examples illustrated in the Gray code generator 320 as shown in FIG. 3 or of the example signals found in the Gray code generator 220 as shown in FIG. 2, and that similarly named and numbered elements described above may therefore be coupled and function similarly below.

As shown in the illustrated example, first clock signal cnt_clk 424 and second clock signal cnt_clk_b 426 are complements or inverted versions of each other. In the example, the phase-aligned GC output signals Q_GC<2:0> 422-1 are directly generated by first clock signal cnt_clk 424 and second clock signal cnt_clk_b 426 as described in FIG. 3, which means they have the same clock source (e.g., clock 323) and the phases are therefore well aligned. It is noted that the numbers inside the Q_GC<2:0> 422-1 pulses in FIG. 4 (e.g., "0", "1", "3", "2", "6", "7", "5", . . . etc.) represent the binary code equivalent values of the Gray code values Q_GC<2>, Q_GC<1>, Q_GC<0> for reference and convenience.

As shown and discussed in the illustrated example, the Q_GC<1> bit of the lower phase-aligned GC values 422-1 is used as a clock source to clock the synchronized binary counter (e.g., the first binary counter 336-1, which is an N+1 bit binary counter, with N=3 as discussed above in FIG. 3) to generate binary code BC1<5:2> 436-1. The N+1 bit binary code BC1<5:2> 436-1 is converted to an N bit Gray code GC<5:3> 440-1 (e.g., with the XOR gates of first binary to GC converter 340-1 as discussed above in FIG. 3).

In the depicted example, the N bit Gray code GC<5:3> 440 is then shifted and phase aligned (e.g., with phase align circuit 334 of FIG. 3) in response to the second clock signal cnt_clk_b 426 to generate phase-aligned Gray code values Q_GC<5:3> 422-2. In the illustrated example, the phase align circuit 334 is coupled to phase shift and align the transitions 444 in the Gray code GC<5:3> 440-1 values by counting 3 falling edges in the second clock signal cnt_clk_b 426. For example, FIG. 4 shows that after transition 444-1 in the Gray code values GC<5:3> 440-1, the corresponding transition 446-1 in phase-aligned GC values Q_GC<5:3> 422-2 is phase shifted or synchronized to occur in response to the $3^{rd}$ falling edge of the second clock signal cnt_clk_b 426 in accordance with the teachings of the present invention. Accordingly, the corresponding transition 448-1 in the final output for phase-aligned GC values Q_GC<5:0> 422-3 is therefore also synchronized or phase-aligned as shown in FIG. 4 in accordance with the teachings of the present invention.

Figure 5:
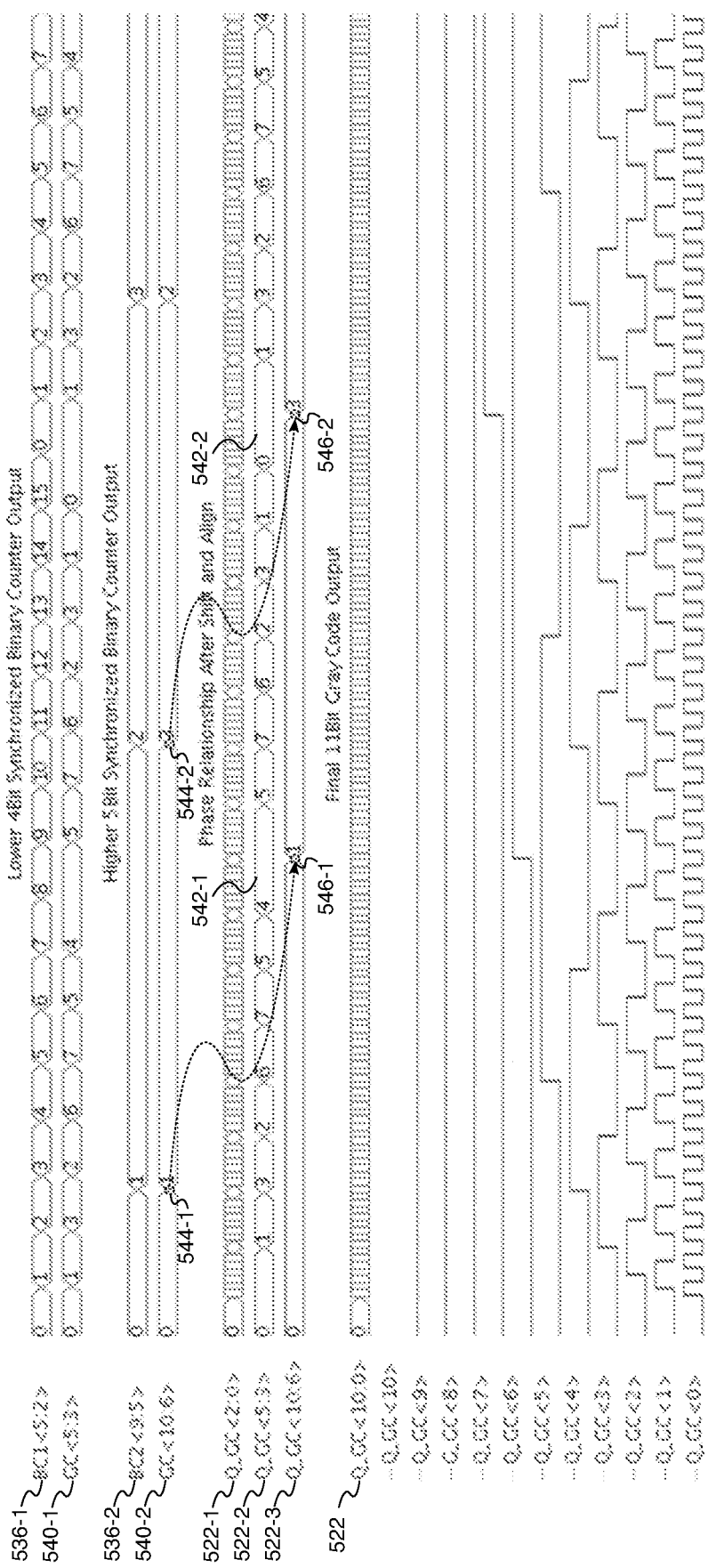
FIG. 5 shows example of timing diagrams illustrating the relative relationships between additional signals in a Gray code generator accordance with the teachings of the present invention.

FIG. 5 shows another example of timing diagrams illustrating the relative relationships between additional signals in a Gray code generator accordance with the teachings of the present invention. It is appreciated the example signals illustrated in FIG. 5 may also be additional examples of the signals illustrated in FIG. 4, or examples illustrated in the Gray code generator 320 as shown in FIG. 3, or of the example signals found in the Gray code generator 220 as shown in FIG. 2, and that similarly named and numbered elements described above may therefore be coupled and function similarly below.

In particular, the example illustrated in FIG. 5 shows that the structure and design solution described above in FIG. 4 to synchronize the final output for phase-aligned GC values Q_GC<5:0> 422-3 is extended similarly to the higher phase-aligned GC bits in accordance with the teachings of the present invention. For instance, the example shown in FIG. 5 shows the binary code BC1<5:2> 536-1 and the Gray code GC<5:3> 540-1 values associated with the first binary counter or lower 4 bit synchronized binary counter output for reference, which were discussed in detail above in FIG. 4. The example in FIG. 5 extends the example for the upper bits and shows the corresponding the code BC2<9:5> 536-2 and the Gray code GC<10:6> 540-2 values associated with the second binary counter or higher/upper 5 bit synchronized binary counter output.

In the illustrated example, another synchronized binary counter (e.g., the second binary counter 336-2, which is an M bit binary counter, with M=5 in the example discussed above in FIG. 3) using Q_GC<N+1> as clock source (with N=3 as discussed above) to generate binary code bits BC2<9:5> 536-2. The binary code bits BC2<9:5> 536-2 are converted to M bit Gray code GC<10:6> 540-2 using for example the XOR gates of second binary to GC converter 340-3 as discussed in detail above in FIG. 3. Continuing with the example, the Gray code GC<10:6> 540-2 is phase shifted and aligned similarly as discussed above in response to corresponding falling edges of the second clock signal cnt_clk_b (e.g., 426) to generate the phase-aligned GC values Q_GC<M+N+2:N+3>, which is equal to Q_GC<5+3+2:3+3> with M=5 and N=3, which is shown in FIG. 5 as phase-aligned GC values Q_GC<10:6> 522-2, which are now synchronized and phase-aligned with the lower bits. Indeed, as shown in the example depicted in FIG. 5, after transition 544-1 in the Gray code GC<10:6> 540-2 values, the corresponding transition 546-1 in phase-aligned GC values Q_GC<10:6> 522-3 is phase shifted or synchronized in response to the second clock signal cnt_clk_b (e.g., 426) to occur at the center of the previous Gray code "1" pulse 542-1 as shown in FIG. 5 in accordance with the teachings of the present invention. Accordingly, the final 11 bit Gray code output for phase-aligned GC values Q_GC<10:0> 522 is therefore also synchronized as shown in FIG. 5 in accordance with the teachings of the present invention.

Figure 6:
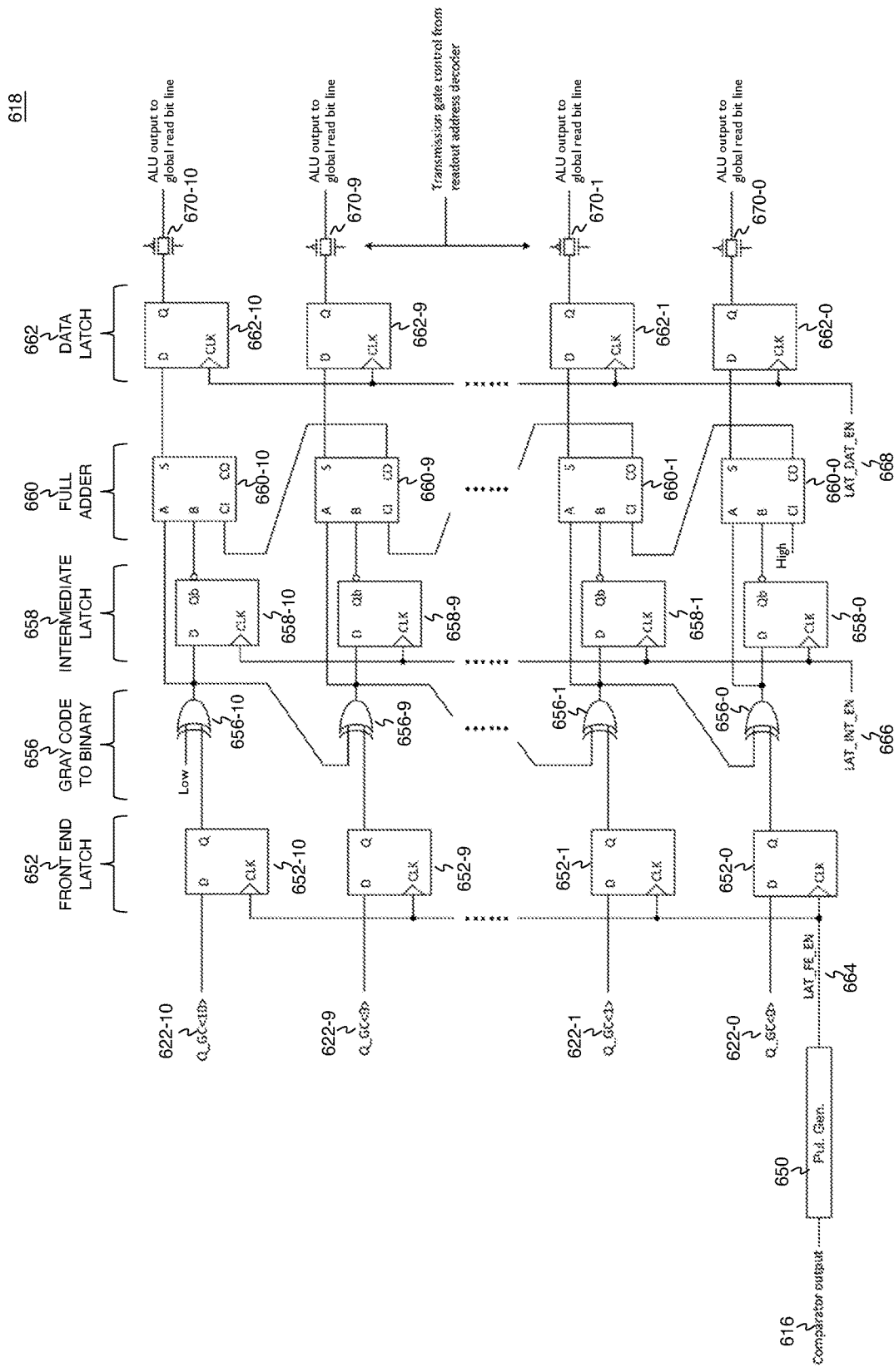
FIG. 6 illustrates a one example of one of a plurality of arithmetic logic units in accordance with the teachings of the present disclosure.

FIG. 6 illustrates a one example of one of a plurality of arithmetic logic units (ALUs) 618 in accordance with the teachings of the present disclosure. It is appreciated the ALU 618 of FIG. 6 may be one example of one of the plurality of column ALUs 218 as shown in FIG. 2, and that similarly named and numbered elements described above are coupled and function similarly below.

As will be shown below in the various examples, it is noted that each one of the plurality of ALUs 618 is coupled to sample and hold or latch the received phase-aligned 11-bit Gray code Q_GC<10:0> 622 in response to a comparator output 616. In one example, each ALU 618 is coupled to latch the phase-aligned 11-bit Gray code Q_GC<10:0> 622 in response to the arrival of a falling edge of comparator output 616 to complete the analog to digital conversion by converting the latched phase-aligned 11-bit Gray code Q_GC<10:0> 622 to a binary value.

In various examples, the plurality of ALUs 618 are further coupled to perform correlated double sampling (CDS) in parallel by latching two phase-aligned 11-bit Gray code Q_GC<10:0> 622 signal values, and then generating the difference between the two values to generate a normalized digital or binary output value for the image data received from the image sensor. For instance, in one example, a first latched phase-aligned Gray code Q_GC<10:0> 622 signal value may be representative of a sampled and held reset (SHR) value from the image sensor. A second latched phase-aligned Gray code Q_GC<10:0> 622 signal value may be representative of a sampled and held signal (SHS) value from the image sensor. In operation, ALU converts the two latched Gray code values to binary code, and then outputs the difference between the two values in accordance with the teachings of the present invention.

To illustrate, the example ALU 618 shown in FIG. 6 includes a front end latch stage 652 coupled to receive and latch phase-aligned Gray code Q_GC<10:0> 622 signal values in response to comparator output 616. In the illustrated example, front end latch stage 652 includes a plurality of flip-flops 652-0 to 652-10, each of which has a data input D coupled to receive a respective bit of phase-aligned Gray code Q_GC<10:0> 622.

In the example, ALU 618 also includes a pulse generator 650 that is coupled to receive the comparator output 616 from the respective comparator (e.g., comparator 216) of the column. In one example, the pulse generator 650 is coupled to generate a front end latch enable signal LAT_FE_EN 664 in response to the arrival of a falling edge in the comparator output 616. In one example, the pulse of front end latch enable signal LAT_FE_EN 664 is coupled to a clock input of each one of the plurality of flip-flops 652-0 to 652-10 of front end latch stage 652.

The example in FIG. 6 shows that ALU 618 also includes a GC to binary stage 656 that is coupled to generate binary representations of the phase-aligned Gray code Q_GC<10:0> 622 signal values received from the front end latch stage 652. In the illustrated example, GC to binary stage 656 includes a plurality of XOR gates 656-0 to 656-10, each of which has an output coupled to generate the corresponding binary bit, and a first input coupled to receive a respective Q output of the plurality of flip-flops 652-0 to 652-10 of front end latch stage 652. In addition, each one of the plurality of XOR gates 656-0 to 656-9 has a second input coupled to receive the output of the neighboring higher bit XOR gate of GC to binary stage 656. In the example, the second input of the XOR gate 656-10 that corresponds to the most significant bit of GC to binary stage 656 is coupled to receive a logic low level (e.g., "0").

In the example, the ALU 618 also includes an intermediate latch stage 658 coupled to the output of GC to binary stage 656 to latch the binary representations of the phase-aligned Gray code Q_GC<10:0> 622 signal values that are received from the front end latch stage 652 in response to an intermediate latch enable signal LAT_INT_EN 666. In the illustrated example, intermediate latch stage 658 includes a plurality of flip-flops 656-0 to 656-10, each of which has a data input D coupled to receive a respective bit from the respective XOR gate of the GC to binary stage 656. In addition, each of the plurality of flip-flops 656-0 to 656-10 includes a clock input coupled to receive the intermediate latch enable signal LAT_INT_EN 666.

As ALU 618 is also coupled to perform correlated double sampling (CDS) operations on two latched phase-aligned 11-bit Gray code Q_GC<10:0> 622 signal values in the illustrated example, ALU 618 also includes a full adder stage 660 including a plurality of full adders 660-0 to 660-10, each of which having a first input "A" coupled to an output of the GC to binary stage 656, a second input "B" coupled to an inverted output "Qb" of the intermediate latch stage 658, and a third input "CI" coupled to receive a logic high carry in value. As such, it is appreciated that adder stage 660 is coupled to generate an output "S" representative of a difference between the output of the GC to binary stage 656 and a binary representation of a phase-aligned GC output latched in the intermediate latch stage 658. The difference between the output of the GC to binary stage 656 and the binary representation of the phase-aligned GC output latched in the intermediate latch stage 658 is the CDS representation of the respective digital image data signal in accordance with the teachings of the present invention.

It is appreciated that the full adder stage 660 is coupled to find the difference between the output of the GC to binary stage 656 and the binary representation of the phase-aligned GC output latched in the intermediate latch stage 658 by adding a "negative" version of the binary representation of the phase-aligned GC output latched in the intermediate latch stage 658 to the output of the GC to binary stage 656. In particular, it is noted that the "B" input of each full adder of adder stage 660 is coupled to the inverted "Qb" output of each one of the plurality of flip-flops 656-0 to 656-10. In addition, the full adder 660-0 that is coupled to receive the least significant bit (LSB) of intermediate latch stage 658 is also coupled to receive a logic high (e.g., "1") at its carry in "CI" input. As such, full adder stage 660 is coupled to add the output of the GC to binary stage 656 with the two's complement equivalent of the binary representation of the phase-aligned GC output latched in the intermediate latch stage 658.

Continuing with the illustrated example, ALU 618 also comprises a data latch stage 662 coupled between the adder stage 660 and an ALU output of the ALU 618. In operation, the data latch stage 662 is coupled to latch the output of the adder stage 660 in response to a data latch enable signal LATA_DAT_EN 668. In the illustrated example, data latch stage 662 includes a plurality of flip-flops 662-0 to 662-10, each of which has a data input D coupled to receive a respective output bit "S" from the full adder the full adder stage 660. In addition, each of the plurality of flip-flops 662-0 to 662-10 includes a clock input coupled to receive the data latch enable signal LAT_DAT_EN 668.

In the depicted example, a plurality of transmission gates 670-0 to 670-10 are coupled between the respective "Q" outputs of the plurality of flip-flops 662-0 to 662-10 and the ALU output. In one example, the ALU output is coupled to a global read bit line. In one example, the ALU output is coupled to a global read bit line via a shift register readout, such as for example as illustrated and described in FIG. 2 above.

Figure 7:
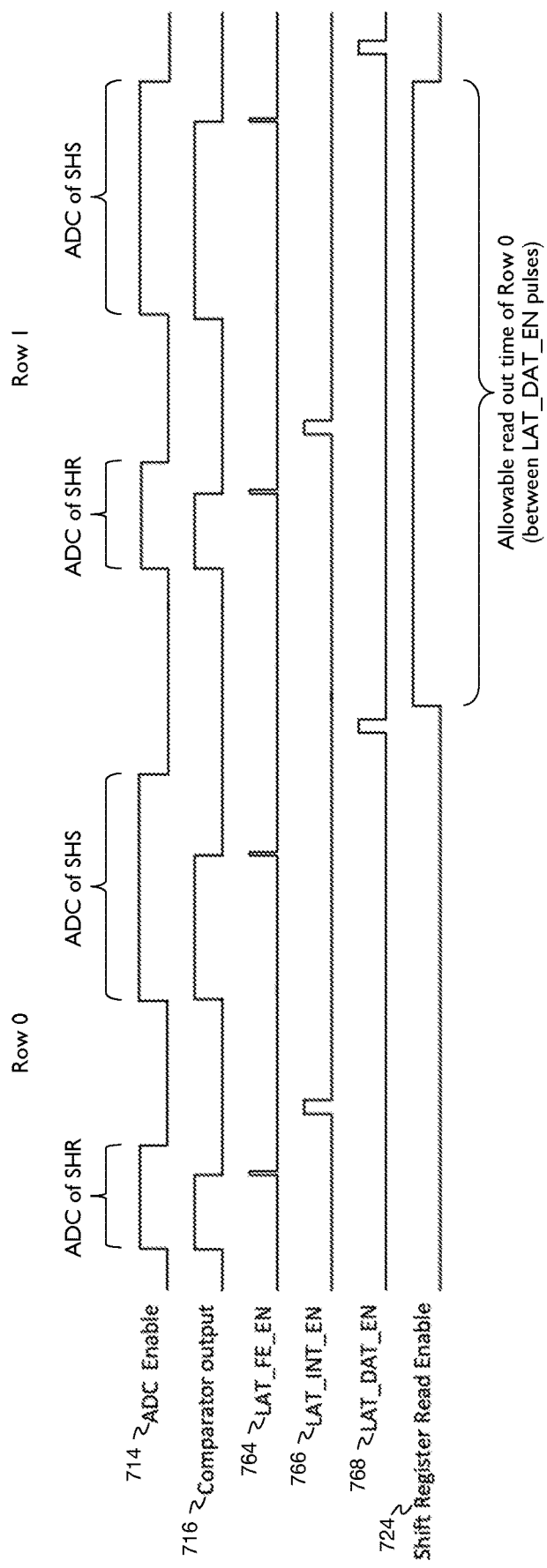
FIG. 7 shows example of timing diagrams illustrating the relative relationships between signals in an example arithmetic logic unit accordance with the teachings of the present invention.

FIG. 7 shows example of timing diagrams illustrating the relative relationships between signals in an example arithmetic logic unit in an imaging system accordance with the teachings of the present invention. It is appreciated the example signals illustrated in FIG. 7 may also be examples illustrated in the ALU 618 as shown in FIG. 6 interacting with the example signals associated with the Gray code generator 320 as shown in FIG. 3, or the plurality of column ALUs 218 interacting with the Gray code generator 220 as shown in FIG. 2, and that similarly named and numbered elements referred to above may therefore be coupled and function similarly below.

In the depicted example, an example ALU in accordance with the teachings of the present invention is described as performing the readout of a first row (e.g., Row 0) and then a second row (e.g., Row 1). In addition, for each row, two samplings of the analog image data from each column bit line (e.g., 212) is performed. The first sampling is the sample and hold of a reset (SHR) value from Row 0 the image sensor. As shown, an analog to digital conversion (ADC) of the SHR value is performed while the ADC enable signal 714 being pulsed high. At this time, the ramp signal (e.g., 214) begins to ramp down in the example while the ADC enable signal 714 is high. As the ramp signal 214 ramps down, the phase-aligned Gray code generator (e.g., 320) increments the phase-aligned Gray code outputs (e.g., 322). When the comparator (e.g., 216) detects that the voltage of the ramp signal 214 equals or falls below the voltage of the analog image data on the column bit line 212, the comparator output signal 716 has a falling edge that causes the front end latch enable signal LAT_FE_EN 764 to pulse, which causes the front end latch stage (e.g., 652) to sample and hold, or latch, the phase-aligned Gray code outputs (e.g., Q_GC<10:0> 622). After the ADC enable signal 714 pulse has occurred and the ADC enable signal 714 drops to a low value, the intermediate latch enable signal LAT_INT_EN 766 pulses, which causes the intermediate latch stage (e.g., 658) to latch the binary representations from the Gray code to binary stage 656 of the phase-aligned Gray code Q_GC<10:0> 622 signal values received from the front end latch stage 652. Therefore, the binary representation of the SHR sample values are latched in the intermediate latch stage (e.g., 658) at this point.

After the binary representation of the SHR sample values are latched, the sample and hold of a signal (SHS) value from Row 0 the image sensor is performed. As shown, the ADC of the SHS value is performed while the ADC enable signal 714 is pulsed high again. At this time, the ramp signal (e.g., 214) begins to ramp down again while the ADC enable signal 714 is high. As the ramp signal 214 ramps down, the phase-aligned Gray code generator (e.g., 320) increments the phase-aligned Gray code outputs (e.g., 322) again. When the comparator (e.g., 216) detects that the voltage of the ramp signal 214 equals or falls below the voltage of the analog image data on the column bit line 212, the comparator output signal 716 has a falling edge causing the front end latch enable signal LAT_FE_EN 764 to pulse again, which causes the front end latch stage (e.g., 652) to sample and hold, or latch, the phase-aligned Gray code outputs (e.g., Q_GC<10:0> 622).

After the second ADC enable signal 714 pulse has occurred and the ADC enable signal 714 drops to a low value for the second time, the "A" inputs of the full adder stage 660 are coupled to receive the binary representations of the phase-aligned Gray code Q_GC<10:0> 622 signal values that are representative of the SHS value, while the "B" inputs and the carry in bit input "CI" of the of the full adder stage 660 are coupled to receive the two's complement or negative binary representations of the phase-aligned Gray code Q_GC<10:0> 622 signal values that are representative of the SHR value. As such, the "S" output of the full adder stage 660 generates the difference between the two values, and the normalized CDS value of the digital or binary representation of the image data is then read out from the column bit line 212 for Row 0.

Thus, at this time when the normalized CDS value of the digital or binary representation of the image data for Row 0 is available from the full adder stage 660, the data latch enable signal LAT_DAT_EN 768 is pulsed, which causes the CDS value of the digital or binary representation of the image data to be latched into the data latch stage 662 of the ALU 618.

Next, the shift register read enable signal 724 is pulsed, allowing the normalized CDS value of the digital or binary representation of the image data to be read out of the ALU 618 through the shift register readout (e.g., 224).

Next, the readout of the next row (e.g., Row 1) may begin, and the process described above with respect to Row 0 is repeated for Row 1. It is noted that the period during which the read out time of Row 0 is allowed is indicated while the shift register read enable signal 724 is high. In the example shown in FIG. 7, this time that shift register read enable signal 724 is high to allow the digitized Row 0 image data to be read out is between the data latch enable signal LAT_DAT_EN 768 pulses.

It is noted therefore, that with the data latch stage 662 storing the normalized CDS value of the digital or binary representation of the image data of Row 0, the shift register read enable signal 724 may remain high to enable the readout of the Row 0 digitized image data while the analog to digital conversion of the Row 1 SHR and SHS image data occurs.

Figure 8:
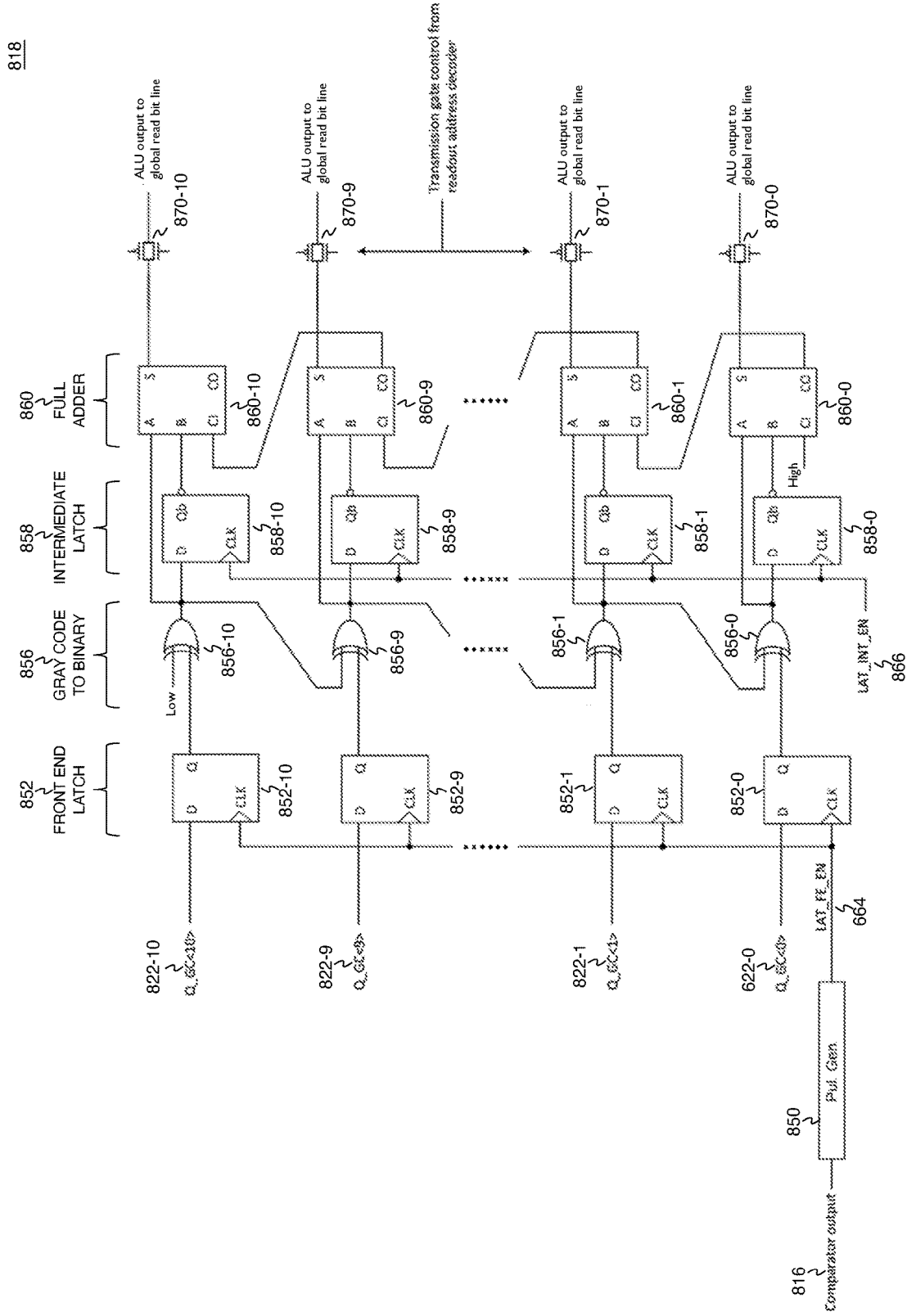
FIG. 8 illustrates another example of one of a plurality of arithmetic logic units in accordance with the teachings of the present disclosure.

FIG. 8 illustrates another example of one of a plurality of arithmetic logic units 818 in accordance with the teachings of the present disclosure. It is appreciated the ALU 818 of FIG. 8 may be another example of ALU 618 of FIG. 6, or another example of one of the plurality of column ALUs 218 as shown in FIG. 2, and that similarly named and numbered elements described above are coupled and function similarly below. It is also appreciated that ALU 818 of FIG. 8 shares many similarities with ALU 618 of FIG. 6.

For instance, as shown in FIG. 8, ALU 818 includes a front end latch stage 852 coupled to receive and latch phase-aligned Gray code Q_GC<10:0> 822 signal values in response to comparator output 816. In the illustrated example, front end latch stage 852 includes a plurality of flip-flops 852-0 to 852-10, each of which has a data input D coupled to receive a respective bit of phase-aligned Gray code Q_GC<10:0> 822.

In the example, the front end latch stage 852 also includes a pulse generator 850 that is coupled to receive the comparator output 816 from the respective comparator (e.g., comparator 216) of the column. In one example, the pulse generator 850 is coupled to generate a front end latch enable signal LAT_FE_EN 864 in response to the arrival of a falling edge in the comparator output 816. In one example, the pulse of front end latch enable signal LAT_FE_EN 864 is coupled to a clock input of each one of the plurality of flip-flops 852-0 to 852-10 of front end latch stage 852.

The example in FIG. 8 shows that ALU 818 also includes a GC to binary stage 856 that is coupled to generate binary representations of the phase-aligned Gray code Q_GC<10:0> 822 signal values received from the front end latch stage 852. In the illustrated example, GC to binary stage 856 includes a plurality of XOR gates 856-0 to 856-10, each of which has an output coupled to generate the corresponding binary bit, and a first input coupled to receive a respective Q output of the plurality of flip-flops 852-0 to 852-10 of front end latch stage 852. In addition, each one of the plurality of XOR gates 856-0 to 856-9 has a second input coupled to receive the output of the neighboring higher bit XOR gate of GC to binary stage 856. In the example, the second input of the XOR gate 856-10 that corresponds to the most significant bit of GC to binary stage 856 is coupled to receive a logic low level (e.g., "0").

In the example, the ALU 818 also includes an intermediate latch stage 858 coupled to the output of GC to binary stage 856 to latch the binary representations of the phase-aligned Gray code Q_GC<10:0> 822 signal values that latched in the front end latch stage 852 in response to an intermediate latch enable signal LAT_INT_EN 866. In the illustrated example, intermediate latch stage 858 includes a plurality of flip-flops 856-0 to 856-10, each of which has a data input D coupled to receive a respective bit from the respective XOR gate of the GC to binary stage 856. In addition, each of the plurality of flip-flops 856-0 to 856-10 includes a clock input coupled to receive the intermediate latch enable signal LAT_INT_EN 866.

As ALU 818 is also coupled to perform correlated double sampling (CDS) operations on two latched phase-aligned 11-bit Gray code Q_GC<10:0> 822 signal values in the illustrated example, ALU 818 also includes a full adder stage 860 including a plurality of full adders 860-0 to 860-10, each of which having a first input "A" coupled to an output of the GC to binary stage 856, a second input "B" coupled to an inverted output "Qb" of the intermediate latch stage 858, and a third input "CI" coupled to receive a logic high carry in value. As such, it is appreciated that adder stage 860 is coupled to generate an output "S" representative of a sum of the output of the GC to binary stage 856 at the "A" input and the two's complement equivalent of the binary representation of a phase-aligned GC output latched in the intermediate latch stage 858 received at the "B" input to determine the difference between the SHS an SHR samplings. The difference between the output of the GC to binary stage 856 and the binary representation of the phase-aligned GC output latched in the intermediate latch stage 858 is the CDS representation of the respective digital image data signal and as generated at the "S" output of the full adder stage 860 in accordance with the teachings of the present invention.

One difference between the ALU 818 of FIG. 8 and the ALU 618 of FIG. 6 is that the ALU 818 of FIG. 8 does not include an equivalent of the data latch stage 662 as shown in FIG. 6. Instead, a plurality of transmission gates 870-0 to 870-10 are coupled between the respective "S" outputs of the plurality of full adders 860-0 to 860-10 and the ALU output. In one example, the ALU output is coupled to a global read bit line. In one example, the ALU output is coupled to a global read bit line via a shift register readout, such as for example as illustrated and described in FIG. 2 above.

Figure 9:
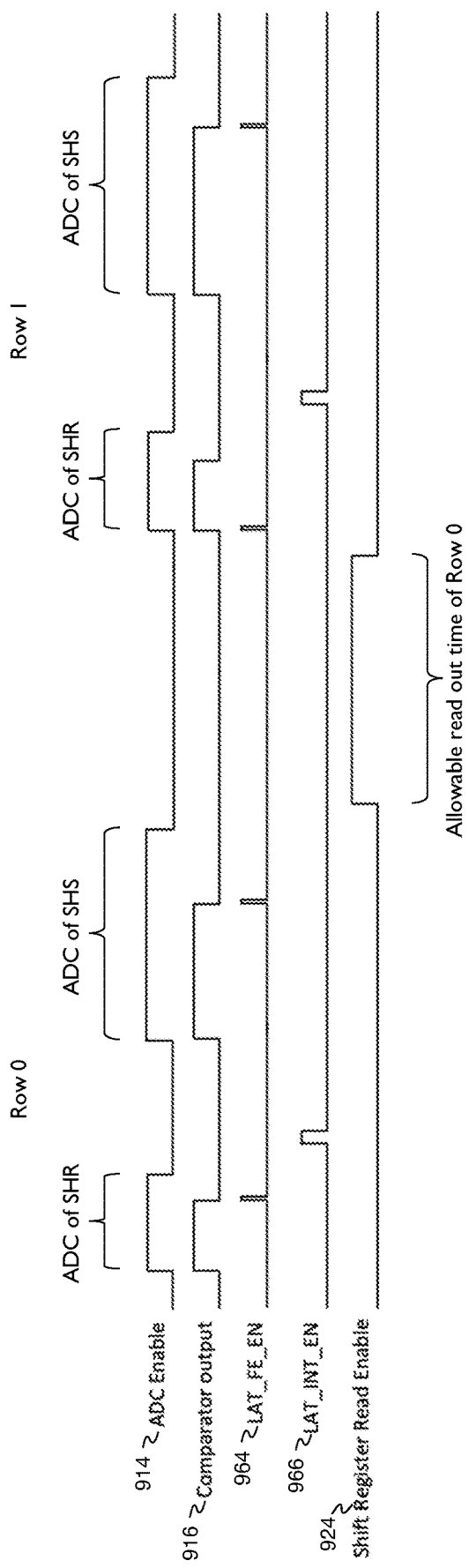
FIG. 9 shows example of timing diagrams illustrating the relative relationships between signals in another example arithmetic logic unit accordance with the teachings of the present invention.

FIG. 9 shows example of timing diagrams illustrating the relative relationships between signals in another example arithmetic logic unit accordance with the teachings of the present invention. It is appreciated the example signals illustrated in FIG. 9 may also be examples illustrated in the ALU 818 as shown in FIG. 8 interacting with the example signals associated with the Gray code generator 320 as shown in FIG. 3, or the plurality of column ALUs 218 interacting with the Gray code generator 220 as shown in FIG. 2, and that similarly named and numbered elements referred to above may therefore be coupled and function similarly below.

As discussed above, one difference between the ALU 818 of FIG. 8 and the ALU 618 of FIG. 6 is that the ALU 818 of FIG. 8 does not include an equivalent of the data latch stage 662 as shown in FIG. 6. As a result, the example ALU 818 of FIG. 8 benefits from a smaller size layout, but with a sacrifice of slower sensor row timing. To illustrate, FIG. 9 shows an example of ALU 818 performing a readout of a first row (e.g., Row 0) and then a second row (e.g., Row 1). For each row, two samplings of the analog image data from each column bit line (e.g., 212) is performed. The first sampling is the sample and hold of a reset (SHR) value from Row 0 the image sensor. As shown, an analog to digital conversion (ADC) of the SHR value is performed while the ADC enable signal 914 being pulsed high. At this time, the ramp signal (e.g., 214) begins to ramp down in the example while the ADC enable signal 914 is high. As the ramp signal 214 ramps down, the phase-aligned Gray code generator (e.g., 320) increments the phase-aligned Gray code outputs (e.g., 322). When the comparator (e.g., 216) detects that the voltage of the ramp signal 214 equals or falls below the voltage of the analog image data on the column bit line 212, the comparator output signal 916 has a falling edge that causes the front end latch enable signal LAT_FE_EN 964 to pulse, which causes the front end latch stage (e.g., 852) to sample and hold, or latch, the phase-aligned Gray code outputs (e.g., Q_GC<10:0> 822). After the ADC enable signal 914 pulse has occurred and the ADC enable signal 914 drops to a low value, the intermediate latch enable signal LAT_INT_EN 966 pulses, which causes the intermediate latch stage (e.g., 858) to latch the binary representations from the Gray code to binary stage 956 of the phase-aligned Gray code Q_GC<10:0> 822 signal values received from the front end latch stage 852. Therefore, the binary representation of the SHR sample values are latched in the intermediate latch stage (e.g., 858) at this point.

After the binary representation of the SHR sample values are latched, the sample and hold of a signal (SHS) value from Row 0 the image sensor is performed. As shown, the ADC of the SHS value is performed while the ADC enable signal 914 is pulsed high again. At this time, the ramp signal (e.g., 214) begins to ramp down again while the ADC enable signal 914 is high. As the ramp signal 214 ramps down, the phase-aligned Gray code generator (e.g., 320) increments the phase-aligned Gray code outputs (e.g., 322) again. When the comparator (e.g., 216) detects that voltage of the ramp signal 214 equals or falls below voltage of the analog image data on the column bit line 212, the comparator output signal 916 has a falling edge causing the front end latch enable signal LAT_FE_EN 964 to pulse again, which causes the front end latch stage (e.g., 852) to sample and hold, or latch, the phase-aligned Gray code outputs (e.g., Q_GC<10:0> 822).

After the second ADC enable signal 914 pulse has occurred and the ADC enable signal 914 drops to a low value for the second time, the "A" inputs of the full adder stage 860 are coupled to receive the binary representations of the phase-aligned Gray code Q_GC<10:0> 822 signal values that are representative of the SHS value, while the "B" inputs and the carry in bit input "CI" of the of the full adder stage 860 are coupled to receive the two's complement or negative binary representations of the phase-aligned Gray code Q_GC<10:0> 822 signal values that are representative of the SHR value. As such, the "S" output of the full adder stage 860 generates the difference between the two values, and the normalized CDS value of the digital or binary representation of the image data from the column bit line 212 for Row 0 is then ready to be read out.

As such, the shift register read enable signal 924 is pulsed, allowing the normalized CDS value of the digital or binary representation of the image data to be read out of the ALU 818 through the shift register readout (e.g., 224).

However, before the readout of the next row (e.g., Row 1) can begin, the pulse of the shift register read enable signal 924 must drop back to a low before the readout of the next row (e.g., Row 1) may begin in ALU 818. Otherwise, without the data latch stage to latch the Row 0 output data, the data would be corrupted if analog to digital conversion occurs for Row 1 while Row 0 is still be read out. After the shift register read enable signal 924 drops to low, the process described above with respect to Row 0 is repeated to read out Row 1.

Figure 10A:
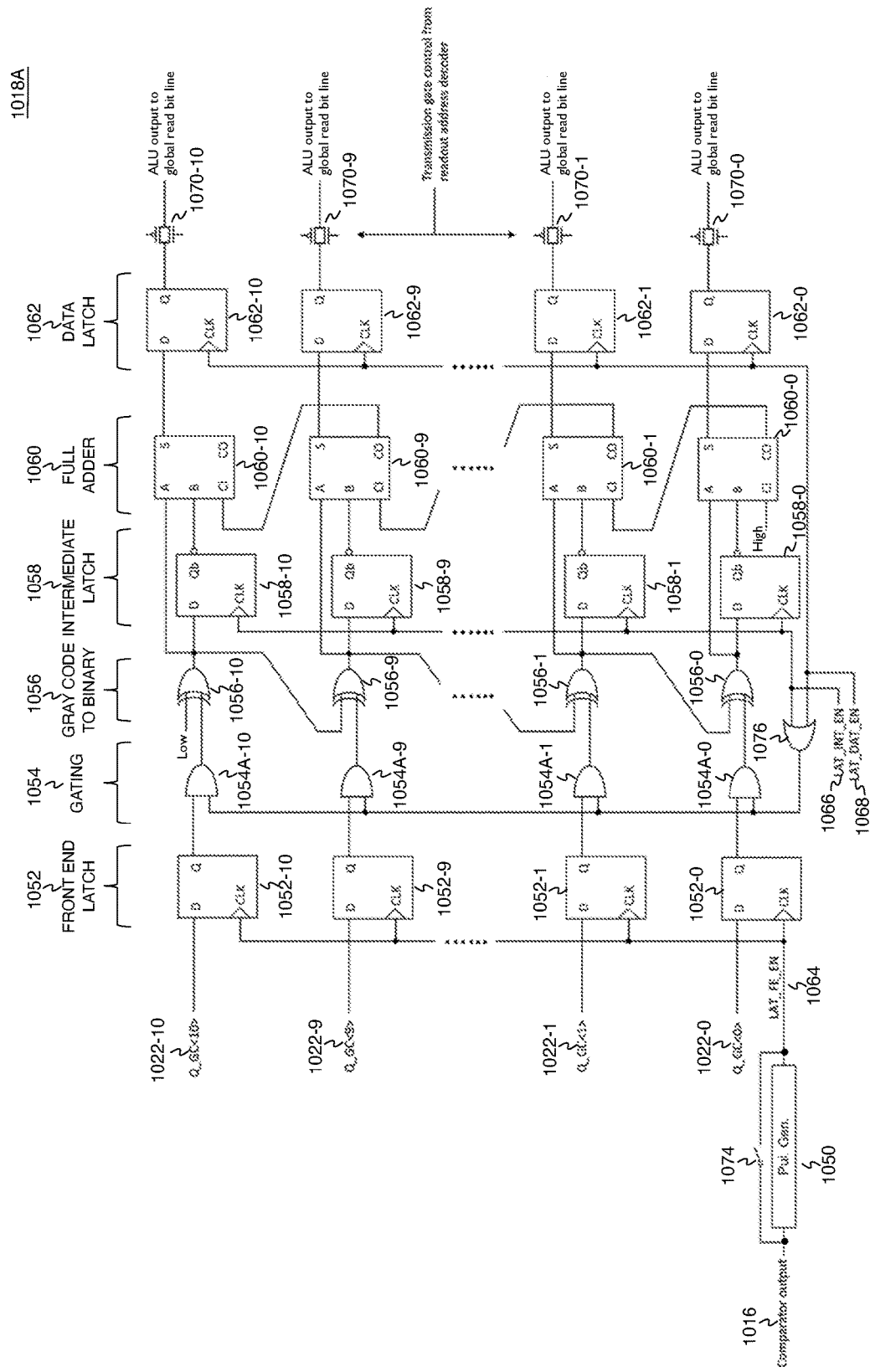
FIG. 10A illustrates yet another example of one of a plurality of arithmetic logic units in accordance with the teachings of the present disclosure.

FIG. 10A illustrates yet another example of one of a plurality of arithmetic logic units 1018A in accordance with the teachings of the present disclosure. It is appreciated the ALU 1018A of FIG. 10A may be another example of ALU 818 of FIG. 8, or another example of another example of ALU 618 of FIG. 6, or another example of one of the plurality of column ALUs 218 as shown in FIG. 2, and that similarly named and numbered elements described above are coupled and function similarly below. It is also appreciated that ALU 1018A of FIG. 10A shares many similarities with ALU 818 of FIG. 8 or ALU 618 of FIG. 6.

For instance, as shown in FIG. 10A, ALU 1018A includes a front end latch stage 1052 coupled to receive and latch phase-aligned Gray code Q_GC<10:0> 1022 signal values in response to comparator output 1016. In the illustrated example, front end latch stage 1052 includes a plurality of flip-flops 1052-0 to 1052-10, each of which has a data input D coupled to receive a respective bit of phase-aligned Gray code Q_GC<10:0> 1022. In the example, the front end latch stage 1052 is coupled to latch the phase-aligned Gray code Q_GC<10:0> 1022 in response to a front end latch enable signal LAT_FE_EN 1064, which is responsive to a comparator output 1016 from the respective comparator (e.g., comparator 216) of the column. In the example shown in FIG. 10A, a pulse generator 1050 is coupled to generate the front end latch enable signal LAT_FE_EN 1064 in response to the arrival of a falling edge in the comparator output 1016. In one example, the pulse of front end latch enable signal LAT_FE_EN 1064 is coupled to a clock input of each one of the plurality of flip-flops 1052-0 to 1052-10 of front end latch stage 1052.

One of the differences between the ALU 1018A of FIG. 10A and the ALU 818A of FIG. 8 or the ALU 618A of FIG. 6 is that the ALU 1018A of FIG. 10A includes a bypass switch 1074 coupled between the input and output of pulse generator 1050 of FIG. 10A to implement a bypass mode. The reason for the bypass mode is because in various examples, the pulse generator 1050 may be sensitive to noise in the VDD supply and/or noise in ground, which may cause unwanted image artifacts. Thus, in excessively noisy conditions, it may be desirable to bypass the pulse generator 1050. In operation, when bypass switch 1074 is closed, the bypass mode is enabled. When the bypass mode is enabled, the front end latch enable signal LAT_FE_EN 1064 is substantially the same or substantially equal to the comparator output 1016. When the bypass switch 1074 is opened, the bypass mode is disabled. When the bypass mode is disabled, the front end latch enable signal LAT_FE_EN 1064 is substantially the same or substantially equal to the output pulse from the pulse generator 1050.

One of the side-effects of when the bypass mode is enabled is that the clock inputs of each one of the plurality of flip-flops 1052-0 to 1052-10 of front end latch stage 1052 receives the comparator output 1016, which remains high until the voltage of the ramp signal (e.g., 214) is equal to or less than the voltage of the analog image data signal on the column bit line (e.g., 212). Thus, while the clock input of each one of the plurality of flip-flops 1052-0 to 1052-10 of front end latch stage 1052 is high, the "Q" outputs of the flip flops remain responsive or sensitive to their respective "D" inputs, which would normally therefore cause downstream XOR gates and full adder circuits to be constantly toggling as the phase-aligned Gray code Q_GC<10:0> 1022 continues to count or increment.

However, in order to limit the downstream effects this constant toggling of the "Q" outputs of the front end latch stage 1052, ALU 1018A also includes a gating stage 1054 coupled to the output of the front end latch stage 1052 and a GC to binary stage 1056. In operation, the gating stage 1054 is configured to couple an input of the GC to binary stage 1056 to the output of the front end latch stage 1052 in response to a data latch enable signal LAT_DAT_EN 1068 or an intermediate latch enable signal LAT_INT_EN 1066. In the example depicted in FIG. 10A, the gating stage 1054 includes an OR gate 1076 having a first input coupled to receive the intermediate latch enable signal LAT_INT_EN 1066 and a second input coupled to receive the data latch enable signal LAT_DAT_EN 1068. Thus, the gating stage 1054 is configured to couple an input of the GC to binary stage 1056 to an output of the front end latch stage 1052 in response to an output of the OR gate.

The example depicted in FIG. 10A also illustrates that the gating stage 1054 also includes a plurality of AND gates 1054A-0 to 1054A-10. Each one of the plurality of AND gates 1054A-0 to 1054A-10 has a first input coupled to the "Q" output of a respective one of a plurality of latches 1052-0 to 1052-10 of the front end latch stage 1052. Each one of the plurality of AND gates 1054A-0 to 1054A-10 has a second input coupled to the output of the OR gate 1076. Each one of the plurality of AND gates 1054A-0 to 1054A-10 has an output coupled to the input of the GC to binary stage 1056.

Continuing with the illustrated example, the GC to binary stage 1056 is coupled to generate binary representations of the phase-aligned Gray code Q_GC<10:0> 1022 signal values that are latched in the front end latch stage 1052 and passed through gating stage 1054. In the illustrated example, GC to binary stage 1056 includes a plurality of XOR gates 1056-0 to 1056-10, each of which has an output coupled to generate the corresponding binary bit, and a first input coupled to receive through gating stage 1054 a respective Q output of the plurality of flip-flops 1052-0 to 1052-10 of front end latch stage 1052. In addition, each one of the plurality of XOR gates 1056-0 to 1056-9 has a second input coupled to receive the output of the neighboring higher bit XOR gate of GC to binary stage 1056. In the example, the second input of the XOR gate 1056-10 that corresponds to the most significant bit of GC to binary stage 1056 is coupled to receive a logic low level (e.g., "0").

In the example, the ALU 1018A also includes the intermediate latch stage 1058 coupled to the output of GC to binary stage 1056 to latch the binary representations of the phase-aligned Gray code Q_GC<10:0> 1022 signal values that latched in the front end latch stage 1052 in response to the intermediate latch enable signal LAT_INT_EN 1066. In the illustrated example, intermediate latch stage 1058 includes a plurality of flip-flops 1056-0 to 1056-10, each of which has a data input D coupled to receive a respective bit from the respective XOR gate of the GC to binary stage 1056. In addition, each of the plurality of flip-flops 1056-0 to 1056-10 includes a clock input coupled to receive the intermediate latch enable signal LAT_INT_EN 1066.

As ALU 1018A is also coupled to perform correlated double sampling (CDS) operations on two latched phase-aligned 11-bit Gray code Q_GC<10:0> 1022 signal values in the illustrated example, ALU 1018A also includes the full adder stage 1060 including a plurality of full adders 1060-0 to 1060-10, each of which having a first input "A" coupled to an output of the GC to binary stage 1056, a second input "B" coupled to an inverted output "Qb" of the intermediate latch stage 1058, and a third input "CI" coupled to receive a logic high carry in value. As such, it is appreciated that adder stage 1060 is coupled to generate an output "S" representative of a sum of the output of the GC to binary stage 1056 at the "A" input and the two's complement equivalent of the binary representation of a phase-aligned GC output latched in the intermediate latch stage 1058 received at the "B" input to determine the difference between the SHS an SHR samplings. The difference between the output of the GC to binary stage 1056 and the binary representation of the phase-aligned GC output latched in the intermediate latch stage 1058 is the CDS representation of the respective digital image data signal and as generated at the "S" output of the full adder stage 1060 in accordance with the teachings of the present invention.

Continuing with the illustrated example, ALU 1018A also comprises a data latch stage 1062 coupled between the adder stage 1060 and an ALU output of the ALU 1018A. In operation, the data latch stage 1062 is coupled to latch the output of the adder stage 1060 in response to the data latch enable signal LATA_DAT_EN 1068. In the illustrated example, data latch stage 1062 includes a plurality of flip-flops 1062-0 to 1062-10, each of which has a data input D coupled to receive a respective output bit "S" from the full adder the full adder stage 1060. In addition, each of the plurality of flip-flops 1062-0 to 1062-10 includes a clock input coupled to receive the data latch enable signal LAT_DAT_EN 1068.

In the depicted example, a plurality of transmission gates 1070-0 to 1070-10 are coupled between the respective "Q" outputs of the plurality of flip-flops 1062-0 to 1062-10 and the ALU output. In one example, the ALU output is coupled to a global read bit line. In one example, the ALU output is coupled to a global read bit line via a shift register readout, such as for example as illustrated and described in FIG. 2 above.

Figure 10B:
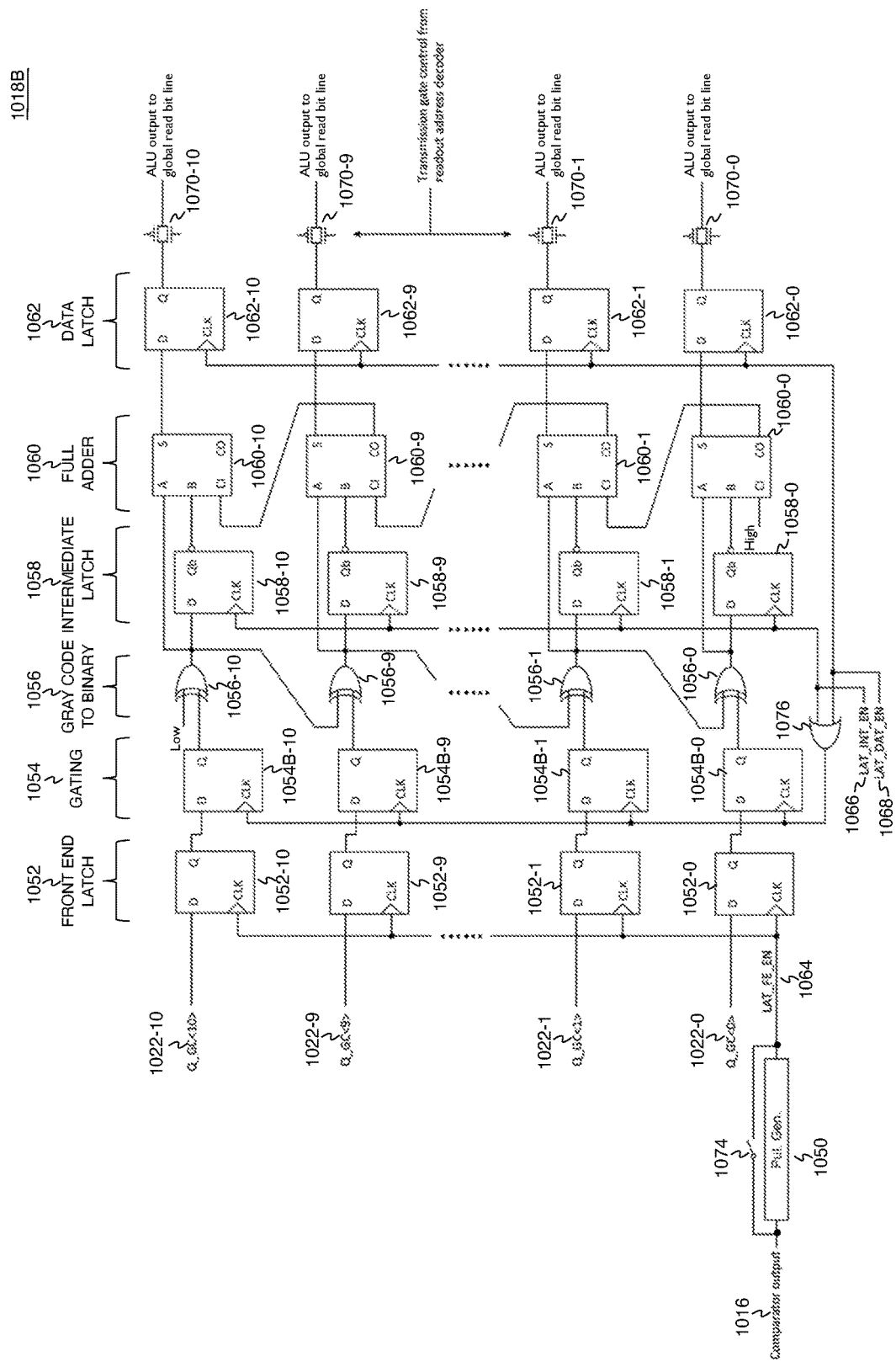
FIG. 10B illustrates still another example of one of a plurality of arithmetic logic units in accordance with the teachings of the present disclosure.

FIG. 10B illustrates still another example of one of a plurality of arithmetic logic units 1018B in accordance with the teachings of the present disclosure. It is appreciated the ALU 1018B of FIG. 10B may be another example of ALU 1018A of FIG. 10A, or ALU 818 of FIG. 8, or another example of another example of ALU 618 of FIG. 6, or another example of one of the plurality of column ALUs 218 as shown in FIG. 2, and that similarly named and numbered elements described above are coupled and function similarly below. It is also appreciated that ALU 1018B of FIG. 10B shares many similarities with ALU 1018A of FIG. 10A, or ALU 818 of FIG. 8, or ALU 618 of FIG. 6.

For instance, as shown in FIG. 10B, ALU 1018B includes a front end latch stage 1052 coupled to receive and latch phase-aligned Gray code Q_GC<10:0> 1022 signal values in response to comparator output 1016. In the illustrated example, front end latch stage 1052 includes a plurality of flip-flops 1052-0 to 1052-10, each of which has a data input D coupled to receive a respective bit of phase-aligned Gray code Q_GC<10:0> 1022. In the example, the front end latch stage 1052 is coupled to latch the phase-aligned Gray code Q_GC<10:0> 1022 in response to a front end latch enable signal LAT_FE_EN 1064, which is responsive to a comparator output 1016 from the respective comparator (e.g., comparator 216) of the column.

In the example shown in FIG. 10B, a pulse generator 1050 is coupled to generate the front end latch enable signal LAT_FE_EN 1064 in response to the arrival of a falling edge in the comparator output 1016. In one example, the pulse of front end latch enable signal LAT_FE_EN 1064 is coupled to a clock input of each one of the plurality of flip-flops 1052-0 to 1052-10 of front end latch stage 1052. A bypass switch 1074 is coupled between the input and output of pulse generator 1050 of FIG. 10B to implement a bypass mode. In operation, when bypass switch 1074 is closed, the bypass mode is enabled. When the bypass mode is enabled, the front end latch enable signal LAT_FE_EN 1064 is substantially the same or substantially equal to the comparator output 1016. When the bypass switch 1074 is opened, the bypass mode is disabled. When the bypass mode is disabled, the front end latch enable signal LAT_FE_EN 1064 is substantially the same or substantially equal to the output pulse from the pulse generator 1050.

In the depicted example, ALU 1018B also includes a gating stage 1054 coupled to the output of the front end latch stage 1052 and a GC to binary stage 1056. In operation, the gating stage 1054 is configured to couple an input of the GC to binary stage 1056 to the output of the front end latch stage 1052 in response to a data latch enable signal LAT_DAT_EN 1068 or an intermediate latch enable signal LAT_INT_EN 1066. In the example depicted in FIG. 10B, the gating stage 1054 includes an OR gate 1076 having a first input coupled to receive the intermediate latch enable signal LAT_INT_EN 1066 and a second input coupled to receive the data latch enable signal LAT_DAT_EN 1068. Thus, the gating stage 1054 is configured to couple an input of the GC to binary stage 1056 to an output of the front end latch stage 1052 in response to an output of the OR gate.

One of the difference between ALU 1018B of FIG. 10B and ALU 1018A of FIG. 10A is that in ALU 1018B of FIG. 10B, the gating stage 1054 includes a plurality of gating latches 1054B-0 to 1054B-10 instead of a plurality of AND gates 1054A-0 to 1054A-10. Each one of the plurality of gating latches 1054B-0 to 1054B-10 has a data input coupled to the "Q" output of a respective one of a plurality of latches 1052-0 to 1052-10 of the front end latch stage 1052. Each one of the plurality of gating latches 1054B-0 to 1054B-10 has a clock input coupled to the output of the OR gate 1076. Each one of the plurality of gating latches 1054B-0 to 1054B-10 has a "Q" output coupled to the input of the GC to binary stage 1056.

Continuing with the illustrated example, the GC to binary stage 1056 is coupled to generate binary representations of the phase-aligned Gray code Q_GC<10:0> 1022 signal values that are latched in the front end latch stage 1052 and passed through gating stage 1054. In the illustrated example, GC to binary stage 1056 includes a plurality of XOR gates 1056-0 to 1056-10, each of which has an output coupled to generate the corresponding binary bit, and a first input coupled to receive through gating stage 1054 a respective Q output of the plurality of flip-flops 1052-0 to 1052-10 of the front end latch stage 1052. In addition, each one of the plurality of XOR gates 1056-0 to 1056-9 has a second input coupled to receive the output of the neighboring higher bit XOR gate of GC to binary stage 1056. In the example, the second input of the XOR gate 1056-10 that corresponds to the most significant bit of GC to binary stage 1056 is coupled to receive a logic low level (e.g., "0").

In the example, the ALU 1018B also includes the intermediate latch stage 1058 coupled to the output of GC to binary stage 1056 to latch the binary representations of the phase-aligned Gray code Q_GC<10:0> 1022 signal values that latched in the front end latch stage 1052 in response to the intermediate latch enable signal LAT_INT_EN 1066. In the illustrated example, intermediate latch stage 1058 includes a plurality of flip-flops 1056-0 to 1056-10, each of which has a data input D coupled to receive a respective bit from the respective XOR gate of the GC to binary stage 1056. In addition, each of the plurality of flip-flops 1056-0 to 1056-10 includes a clock input coupled to receive the intermediate latch enable signal LAT_INT_EN 1066.

As ALU 1018B is also coupled to perform correlated double sampling (CDS) operations on two latched phase-aligned 11-bit Gray code Q_GC<10:0> 1022 signal values in the illustrated example, ALU 1018B also includes the full adder stage 1060 including a plurality of full adders 1060-0 to 1060-10, each of which having a first input "A" coupled to an output of the GC to binary stage 1056, a second input "B" coupled to an inverted output "Qb" of the intermediate latch stage 1058, and a third input "CI" coupled to receive a logic high carry in value. As such, it is appreciated that adder stage 1060 is coupled to generate an output "S" representative of a sum of the output of the GC to binary stage 1056 at the "A" input and the two's complement equivalent of the binary representation of a phase-aligned GC output latched in the intermediate latch stage 1058 received at the "B" input to determine the difference between the SHS an SHR samplings. The difference between the output of the GC to binary stage 1056 and the binary representation of the phase-aligned GC output latched in the intermediate latch stage 1058 is the CDS representation of the respective digital image data signal and as generated at the "S" output of the full adder stage 1060 in accordance with the teachings of the present invention.

Continuing with the illustrated example, ALU 1018B also comprises a data latch stage 1062 coupled between the adder stage 1060 and an ALU output of the ALU 1018B. In operation, the data latch stage 1062 is coupled to latch the output of the adder stage 1060 in response to the data latch enable signal LATA_DAT_EN 1068. In the illustrated example, data latch stage 1062 includes a plurality of flip-flops 1062-0 to 1062-10, each of which has a data input D coupled to receive a respective output bit "S" from the full adder the full adder stage 1060. In addition, each of the plurality of flip-flops 1062-0 to 1062-10 includes a clock input coupled to receive the data latch enable signal LAT_DAT_EN 1068.

In the depicted example, a plurality of transmission gates 1070-0 to 1070-10 are coupled between the respective "Q" outputs of the plurality of flip-flops 1062-0 to 1062-10 and the ALU output. In one example, the ALU output is coupled to a global read bit line. In one example, the ALU output is coupled to a global read bit line via a shift register readout, such as for example as illustrated and described in FIG. 2 above.

Figure 11:
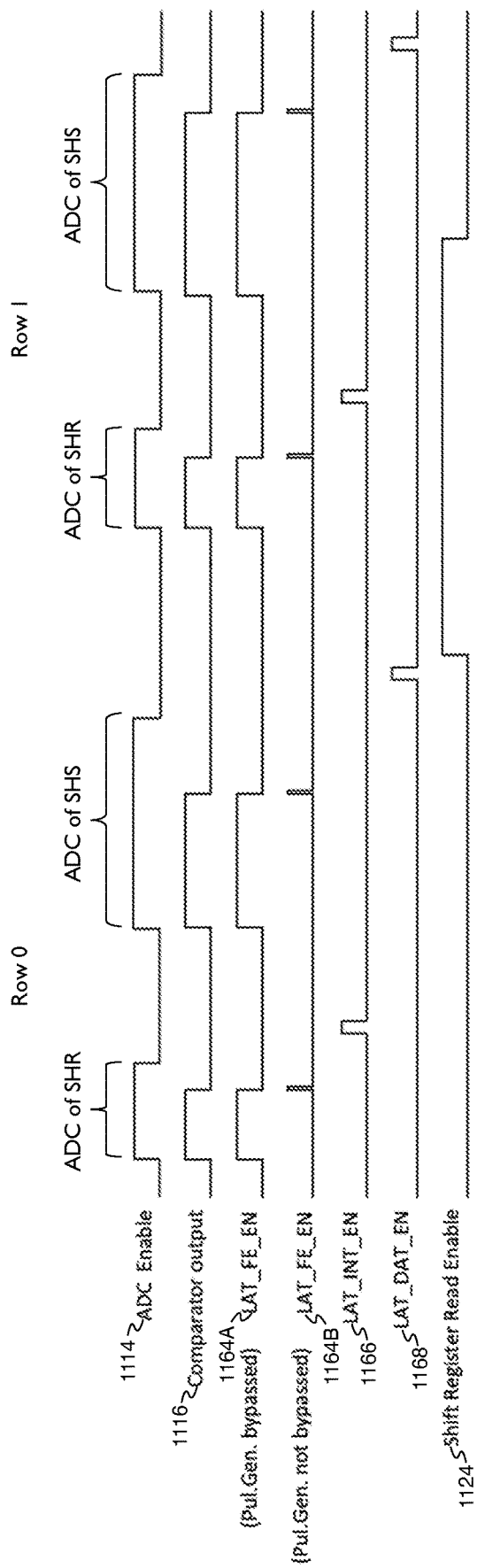
FIG. 11 shows example of timing diagrams illustrating the relative relationships between signals in yet another example arithmetic logic unit accordance with the teachings of the present invention.

FIG. 11 shows example of timing diagrams illustrating the relative relationships between signals in yet other examples of arithmetic logic units accordance with the teachings of the present invention. It is appreciated the example signals illustrated in FIG. 11 may also be examples illustrated in the ALU 1018A of FIG. 10A or in ALU 1018B of FIG. 10B interacting with the example signals associated with the Gray code generator 320 as shown in FIG. 3, or the plurality of column ALUs 218 interacting with the Gray code generator 220 as shown in FIG. 2, and that similarly named and numbered elements referred to above may therefore be coupled and function similarly below.

As discussed above, one difference between the ALU 1018A of FIG. 10A or in ALU 1018B of FIG. 10B and the ALU 818 of FIG. 8 or ALU 618 of FIG. 6 is that the ALU 1018A of FIG. 10A or the ALU 1018B of FIG. 10B include a bypass mode and gating stage 1054. As a result, when the bypass mode is enabled, the "Q" outputs of the front end latch stage 1052 toggle while the comparator output is high, which is addressed with gating stage 1054.

To illustrate, FIG. 11 shows an example of ALU 1018A and/or ALU 1018B performing a readout of a first row (e.g., Row 0) and then a second row (e.g., Row 1). For each row, two samplings of the analog image data from each column bit line (e.g., 212) is performed. The first sampling is the sample and hold of a reset (SHR) value from Row 0 the image sensor. As shown, an analog to digital conversion (ADC) of the SHR value is performed while the ADC enable signal 1114 is being pulsed high. At this time, the ramp signal (e.g., 214) begins to ramp down in the example while the ADC enable signal 1114 is high. As the ramp signal 214 ramps down, the phase-aligned Gray code generator (e.g., 320) increments the phase-aligned Gray code outputs (e.g., 322). As discussed, while the voltage of the ramp signal 214 is still greater than the voltage of the analog image data on the column bit line 212, the phase-aligned Gray code outputs (e.g., Q_GC<10:0> 1022) continue to toggle or increment. FIG. 11 shows that when the pulse generator 1050 is in bypass mode (e.g., bypass switch 1074 is closed), the front end latch enable signal LAT_FE_EN 1164A is substantially equal to the comparator output 1116, and that when the pulse generator 1050 is not in bypass mode (e.g., bypass switch 1074 is opened), the front end latch enable signal LAT_FE_EN 1164A is substantially equal to the output pulse of the pulse generator 1150.

Continuing with the example, when the comparator (e.g., 216) detects that the voltage of the ramp signal 214 equals or falls below the voltage of the analog image data on the column bit line 212, the comparator output signal 1116 has a falling edge that causes the front end latch enable signal LAT_FE_EN 1164A to have a corresponding falling edge when in bypass mode, or the front end latch enable signal LAT_FE_EN 1164B to pulse when not in bypass mode, both of which cause the front end latch stage (e.g., 1052) to sample and hold, or latch, the phase-aligned Gray code outputs (e.g., Q_GC<10:0> 1022). After the ADC enable signal 1114 pulse has occurred and the ADC enable signal 1114 drops to a low value, the intermediate latch enable signal LAT_INT_EN 1166 pulses, which causes the gating stage 1054 to pass the output of the front end latch stage 1052 to the Gray code to binary stage 1056. In addition, the intermediate latch enable signal LAT_INT_EN 1166 pulse causes the intermediate latch stage (e.g., 1058) to latch the binary representations from the Gray code to binary stage 1056 of the phase-aligned Gray code Q_GC<10:0> 1022 signal values that are received from the front end latch stage 1052. Therefore, the binary representation of the SHR sample values are latched in the intermediate latch stage (e.g., 1058) at this point.

After the binary representation of the SHR sample values are latched, the sample and hold of a signal (SHS) value from Row 0 the image sensor is performed. As shown, the ADC of the SHS value is performed while the ADC enable signal 1114 is pulsed high again. At this time, the ramp signal (e.g., 214) begins to ramp down again while the ADC enable signal 1114 is high. As the ramp signal 214 ramps down, the phase-aligned Gray code generator (e.g., 320) increments the phase-aligned Gray code outputs (e.g., 322) again. As discussed previously, while voltage of the ramp signal 214 is still greater than the voltage of the analog image data on the column bit line 212, the phase-aligned Gray code outputs (e.g., Q_GC<10:0> 1022) continue to toggle or increment again. FIG. 11 shows again that when the pulse generator 1050 is in bypass mode (e.g., bypass switch 1074 is closed), the front end latch enable signal LAT_FE_EN 1164A is substantially equal to the comparator output 1116, and that when the pulse generator 1050 is not in bypass mode (e.g., bypass switch 1074 is opened), the front end latch enable signal LAT_FE_EN 1164A is substantially equal to the output pulse of the pulse generator 1150.

Continuing with the example, when the comparator (e.g., 216) detects that voltage of the ramp signal 214 equals or falls below the voltage of the analog image data on the column bit line 212, the comparator output signal 1116 has a falling edge that causes the front end latch enable signal LAT_FE_EN 1164A to have a corresponding falling edge when in bypass mode, or the front end latch enable signal LAT_FE_EN 1164B to pulse when not in bypass mode, both of which cause the front end latch stage (e.g., 1052) to sample and hold, or latch, the phase-aligned Gray code outputs (e.g., Q_GC<10:0> 1022) again.

After the second ADC enable signal 1114 pulse has occurred and the ADC enable signal 1114 drops to a low value for the second time, the data latch enable signal LAT_DATA_EN 1168 pulses, which causes the gating stage 1054 to pass the output of the front end latch stage 1052 to the Gray code to binary stage 1056. At this time, the "A" inputs of the full adder stage 1060 are therefore now coupled to receive the binary representations from the Gray code to binary stage 1056 of the phase-aligned Gray code Q_GC<10:0> 1022 signal values from the front end latch stage 1052, which now are representative of the SHS value, while the "B" inputs and the carry in bit input "CI" of the of the full adder stage 1060 are coupled to receive the two's complement or negative binary representations of the phase-aligned Gray code Q_GC<10:0> 1022 signal values from the intermediate latch stage 1058, which are representative of the SHR value. As such, the "S" output of the full adder stage 1060 generates the difference between the two values, and the normalized CDS value of the digital or binary representation of the image data from the column bit line 212 for Row 0 is then ready to be read out from the output of the full adder stage 1060. The data latch enable signal LAT_DAT_EN 1168 pulse also causes the data latch stage (e.g., 1062) to latch the normalized CDS value of the digital or binary representation of the image data from the output of the full adder stage 1060.

As such, the shift register read enable signal 1124 is pulsed next, allowing the normalized CDS value of the digital or binary representation of the image data to be read out of the ALU 1018A or ALU 1018B through the shift register readout (e.g., 224).

Next, the readout of the next row (e.g., Row 1) may begin, and the process described above with respect to Row 0 is repeated for Row 1. It is noted that the period during which the read out time of Row 0 is allowed is indicated while the shift register read enable signal 1124 is high. It is noted that in the example shown in FIG. 11, with the inclusion of data latch stage 1062, the available time that shift register read enable signal 1124 is high to allow the digitized Row 0 image data to be read out has at least some overlap with the time during which ADC operations may occur during the read out Row 1 image data.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A readout circuit for use in an image sensor, comprising:
    a plurality of comparators, wherein each one of the plurality of comparators is coupled to receive a ramp signal, wherein each one of the plurality of comparators is further coupled to a respective one of a plurality of column bit lines from the image sensor to receive a respective analog image data signal, wherein each one of the plurality of comparators is coupled to generate a respective comparator output in response to a comparison of the respective analog image data signal and the ramp signal;
    a Gray code (GC) generator coupled to generate phase-aligned GC outputs; and a plurality of arithmetic logic units (ALUs), wherein each one of the plurality of ALUs is coupled to receive the phase-aligned GC outputs, wherein each one of the plurality of ALUs is further coupled to a respective one of the plurality of comparators to receive the respective comparator output, wherein each one of the plurality of ALUs is coupled to latch the phase-aligned GC outputs in response to the respective comparator output to generate a respective digital image data signal.

2. The readout circuit of claim 1, wherein the readout circuit is one of a plurality of readout circuits coupled to the plurality of column bitlines of the image sensor, wherein shift readout registers are coupled to respective ALUs coupled to first and last columns of the image sensor, and wherein shift readout registers are coupled to and are interspersed between the plurality of ALUs of each of the plurality of readout circuits to readout the respective digital image data signals from the plurality of ALUs.

3. The readout circuit of claim 1, wherein the GC generator comprises:
a plurality of divide circuits coupled to generate a plurality of lower GC bits in response to a clock;
a first binary counter coupled to generate a first plurality of binary bits in response to one of the plurality of lower GC bits;
a first binary to GC converter coupled to generate a plurality of intermediate GC bits in response to the first plurality of binary bits;
a phase-align circuit coupled to generate a plurality of phase-aligned intermediate GC bits in response to the clock and the plurality of intermediate GC bits;
a second binary counter coupled to generate a second plurality of binary bits in response to one of the plurality of phase-aligned intermediate GC bits; and
a second binary to GC converter coupled to generate a plurality of upper GC bits in response to the second plurality of binary bits,
wherein the phase-align circuit is further coupled to generate a plurality of phase-aligned upper GC bits in response to the clock and the plurality of upper GC bits, wherein the phase-aligned GC outputs comprise the plurality of lower GC bits, the plurality of phase-aligned intermediate GC bits, and the plurality of phase-aligned upper GC bits.

4. The readout circuit of claim 3, wherein the plurality of divide circuits comprises:
a first divide circuit coupled to generate a first bit of the phase-aligned GC outputs in response to the clock;
a second divide circuit coupled to generate a second bit of the phase-aligned GC outputs in response to the clock; and
a third divide circuit coupled to generate a third bit of the phase-aligned GC outputs in response to the clock.

5. The readout circuit of claim 4, wherein the clock comprises a first count clock and second count clock, wherein the first and second count clocks are complements of each other,
wherein the first divide circuit comprises a divide by 2 circuit coupled to generate a first bit of the phase-aligned GC outputs bits in response to the first count clock,
wherein the second divide circuit comprises a divide by 4 circuit coupled to generate a second bit of the phase-aligned GC outputs in response to the second count clock, and wherein the third divide circuit comprises a divide by 8 circuit coupled to generate a third bit of the phase-aligned GC outputs in response to the second count clock.

6. The readout circuit of claim 5, wherein the first binary counter is coupled to generate the first plurality of binary bits in response to in response to the second bit of the phase-aligned GC outputs.

7. The readout circuit of claim 6, wherein the phase-align circuit is coupled to generate the plurality of phase-aligned intermediate GC bits in response to the second count clock and the plurality of intermediate GC bits, and wherein the phase-align circuit is further coupled to generate the plurality of phase-aligned upper GC bits in response to the second count clock and the plurality of upper GC bits.

8. The readout circuit of claim 7,
wherein the plurality of phase-aligned intermediate GC bits comprises a fourth bit of the phase-aligned GC outputs, a fifth bit of the phase-aligned GC outputs, and a sixth bit of the phase-aligned GC outputs, and
wherein the plurality of phase-aligned upper GC bits comprises a seventh bit of the phase-aligned GC outputs, an eighth bit of the phase-aligned GC outputs, a ninth bit of the phase-aligned GC outputs, a tenth bit of the phase-aligned GC outputs, and an eleventh bit of the phase-aligned GC outputs.

9. The readout circuit of claim 8, wherein the second binary counter is coupled to generate the second plurality of binary bits in response to in response to the fifth bit of the phase-aligned GC outputs.

10. The readout circuit of claim 9, wherein a most significant bit of the first plurality of binary bits generated by the first binary counter is substantially equal to a least significant bit of the second plurality of binary bits generated by the second binary counter.

11. The readout circuit of claim 10,
wherein the first binary to GC converter comprises a first plurality of exclusive-OR (XOR) gates, wherein each one of the first plurality of XOR gates is coupled to generate a respective one of the plurality of intermediate GC bits in response to the first plurality of binary bits from the first binary counter,
wherein a most significant bit of the plurality of upper GC bits is substantially equal to a most significant bit of the second plurality of binary bits from the second binary counter, and
wherein the second binary to GC converter comprises a second plurality of exclusive-or (XOR) gates, wherein each one of the second plurality of XOR gates is coupled to generate a respective one of remaining lower significant bits of the plurality of upper GC bits in response to remaining lower significant bits of the second plurality of binary bits from the second binary counter.

12. The readout circuit of claim 1, wherein each one of the plurality of ALUs is further coupled to latch two phase-aligned GC outputs in response to two respective comparator outputs to generate a correlated double sampling (CDS) representation of the respective digital image data signal.

13. The readout circuit of claim 12, wherein the each one of the plurality of ALUs comprises:
a front end latch stage coupled to latch the phase-aligned GC outputs in response to the respective comparator;
a GC to binary stage coupled to generate binary representations of the phase-aligned GC outputs latched in the front end latch stage;

an intermediate latch stage coupled to latch the binary representations of the phase-aligned GC outputs latched in the front end latch stage in response to an intermediate latch enable signal;

an adder stage having a first input coupled to an output of the GC to binary stage, a second input coupled to an inverted output of the intermediate latch stage, and a third input coupled to receive a logic high carry in value, wherein the adder stage is coupled to generate an output representative of a difference between the output of the GC to binary stage and a binary representation of a phase-aligned GC output latched in the intermediate latch stage, wherein the difference between the output of the GC to binary stage and the binary representation of the phase-aligned GC output latched in the intermediate latch stage is the CDS representation of the respective digital image data signal; and an ALU output coupled to an output of the adder stage.

14. The readout circuit of claim 13, wherein the each one of the plurality of ALUs further comprises a pulse generator coupled to generate a front end latch enable signal in response to the respective comparator, wherein the front end latch stage is coupled to latch the phase-aligned GC outputs in response to the front end latch enable signal.

15. The readout circuit of claim 14, wherein the each one of the plurality of ALUs further comprises a data latch stage coupled between the adder stage and the ALU output, wherein the data latch stage is coupled to latch the output of the adder stage in response to a data latch enable signal.

16. The readout circuit of claim 15, wherein the each one of the plurality of ALUs further comprises bypass switch coupled between an input of the pulse generator and an output of the pulse generator, wherein the front end latch enable signal is substantially equal to an output of the respective comparator when the bypass switch is closed, wherein the front end latch enable signal is substantially equal to an output of the pulse generator when the bypass switch is opened.

17. The readout circuit of claim 16, wherein the each one of the plurality of ALUs further comprises a gating stage coupled between the front end latch stage and the GC to binary stage, wherein the gating stage is configured to couple an input of the GC to binary stage to an output of the front end latch stage in response to the data latch enable signal or the intermediate latch enable signal.

18. The readout circuit of claim 17, wherein the gating stage comprises an OR gate having a first input coupled to receive the intermediate latch enable signal and a second input coupled to receive the data latch enable signal, wherein the gating stage is configured to couple an input of the GC to binary stage to an output of the front end latch stage in response to an output of the OR gate.

19. The readout circuit of claim 18, wherein the gating stage further comprises a plurality of AND gates, wherein each one of the plurality of AND gates has a first input coupled to an output of a respective one of a plurality of latches of the front end latch stage, wherein each one of the plurality of AND gates has a second input coupled to the output of the OR gate, and wherein each one of the plurality of AND gates has an output coupled to the input of the GC to binary stage.

20. The readout circuit of claim 18, wherein the gating stage further comprises a plurality of gating latches, wherein each one of the plurality of gating latches has a data input coupled to an output of a respective one of a plurality of latches of the front end latch stage, wherein each one of the plurality of gating latches has a clock input coupled to the output of the OR gate, and wherein each one of the plurality of gating latches has an output coupled to the input of the GC to binary stage.

21. An imaging system, comprising:
a pixel array including a plurality of pixel circuits arranged into rows and columns, wherein each one of the plurality of pixel circuits is coupled to generate an analog image data signal in response to incident light;
control circuitry coupled to the pixel array to control operation of the pixel array; and
a readout circuitry coupled to the pixel array through a plurality of column bit lines, wherein the readout circuitry comprises:
a plurality of comparators, wherein each one of the plurality of comparators is coupled to receive a ramp signal, wherein each one of the plurality of comparators is further coupled to a respective one of a plurality of column bit lines to receive a respective analog image data signal, wherein each one of the plurality of comparators is coupled to generate a respective comparator output in response to a comparison of the respective analog image data signal and the ramp signal;
a Gray code (GC) generator coupled to generate phase-aligned GC outputs; and
a plurality of arithmetic logic units (ALUs), wherein each one of the plurality of ALUs is coupled to receive the phase-aligned GC outputs, wherein each one of the plurality of ALUs is further coupled to a respective one of the plurality of comparators to receive the respective comparator output, wherein each one of the plurality of ALUs is coupled to latch the phase-aligned GC outputs in response to the respective comparator output to generate a respective digital image data signal.

22. The imaging system of claim 21, further comprising function logic coupled to the readout circuitry to store the image data read out from the pixel array.

23. The imaging system of claim 21, wherein the readout circuit is one of a plurality of readout circuits coupled to the plurality of column bitlines of the image sensor, wherein shift readout registers are coupled to respective ALUs coupled to first and last columns of the image sensor, and wherein shift readout registers are coupled to and are interspersed between the plurality of ALUs of each of the plurality of readout circuits to readout the respective digital image data signals from the plurality of ALUs.

24. The imaging system of claim 21, wherein the GC generator comprises:
a plurality of divide circuits coupled to generate a plurality of lower GC bits in response to a clock;
a first binary counter coupled to generate a first plurality of binary bits in response to one of the plurality of lower GC bits;
a first binary to GC converter coupled to generate a plurality of intermediate GC bits in response to the first plurality of binary bits;
a phase-align circuit coupled to generate a plurality of phase-aligned intermediate GC bits in response to the clock and the plurality of intermediate GC bits;
a second binary counter coupled to generate a second plurality of binary bits in response to one of the plurality of phase-aligned intermediate GC bits; and
a second binary to GC converter coupled to generate a plurality of upper GC bits in response to the second plurality of binary bits, wherein the phase-align circuit is further coupled to generate a plurality of phase-aligned upper GC bits in response to the clock and the plurality of upper GC bits, wherein the phase-aligned GC outputs comprise the plurality of lower GC bits, the plurality of phase-aligned intermediate GC bits, and the plurality of phase-aligned upper GC bits.

25. The imaging system of claim 24, wherein the plurality of divide circuits comprises:
a first divide circuit coupled to generate a first bit of the phase-aligned GC outputs in response to the clock;
a second divide circuit coupled to generate a second bit of the phase-aligned GC outputs in response to the clock; and
a third divide circuit coupled to generate a third bit of the phase-aligned GC outputs in response to the clock.

26. The imaging system of claim 25, wherein the clock comprises a first count clock and second count clock, wherein the first and second count clocks are complements of each other,
wherein the first divide circuit comprises a divide by 2 circuit coupled to generate a first bit of the phase-aligned GC outputs bits in response to the first count clock,
wherein the second divide circuit comprises a divide by 4 circuit coupled to generate a second bit of the phase-aligned GC outputs in response to the second count clock, and
wherein the third divide circuit comprises a divide by 8 circuit coupled to generate a third bit of the phase-aligned GC outputs in response to the second count clock.

27. The imaging system of claim 26, wherein the first binary counter is coupled to generate the first plurality of binary bits in response to in response to the second bit of the phase-aligned GC outputs.

28. The imaging system of claim 27, wherein the phase-align circuit is coupled to generate the plurality of phase-aligned intermediate GC bits in response to the second count clock and the plurality of intermediate GC bits, and wherein the phase-align circuit is further coupled to generate the plurality of phase-aligned upper GC bits in response to the second count clock and the plurality of upper GC bits.

29. The imaging system of claim 28,
wherein the plurality of phase-aligned intermediate GC bits comprises a fourth bit of the phase-aligned GC outputs, a fifth bit of the phase-aligned GC outputs, and a sixth bit of the phase-aligned GC outputs, and
wherein the plurality of phase-aligned upper GC bits comprises a seventh bit of the phase-aligned GC outputs, an eighth bit of the phase-aligned GC outputs, a ninth bit of the phase-aligned GC outputs, a tenth bit of the phase-aligned GC outputs, and an eleventh bit of the phase-aligned GC outputs.

30. The imaging system of claim 29, wherein the second binary counter is coupled to generate the second plurality of binary bits in response to in response to the fifth bit of the phase-aligned GC outputs.

31. The imaging system of claim 30, wherein a most significant bit of the first plurality of binary bits generated by the first binary counter is substantially equal to a least significant bit of the second plurality of binary bits generated by the second binary counter.

32. The imaging system of claim 31,
wherein the first binary to GC converter comprises a first plurality of exclusive-OR (XOR) gates, wherein each one of the first plurality of XOR gates is coupled to generate a respective one of the plurality of intermediate GC bits in response to the first plurality of binary bits from the first binary counter,
wherein a most significant bit of the plurality of upper GC bits is substantially equal to a most significant bit of the second plurality of binary bits from the second binary counter, and
wherein the second binary to GC converter comprises a second plurality of exclusive-or (XOR) gates, wherein each one of the second plurality of XOR gates is coupled to generate a respective one of remaining lower significant bits of the plurality of upper GC bits in response to remaining lower significant bits of the second plurality of binary bits from the second binary counter.

33. The imaging system of claim 21, wherein each one of the plurality of ALUs is further coupled to latch two phase-aligned GC outputs in response to two respective comparator outputs to generate a correlated double sampling (CDS) representation of the respective digital image data signal.

34. The imaging system of claim 33, wherein the each one of the plurality of ALUs comprises:
a front end latch stage coupled to latch the phase-aligned GC outputs in response to the respective comparator;
a GC to binary stage coupled to generate binary representations of the phase-aligned GC outputs latched in the front end latch stage;
an intermediate latch stage coupled to latch the binary representations of the phase-aligned GC outputs latched in the front end latch stage in response to an intermediate latch enable signal;
an adder stage having a first input coupled to an output of the GC to binary stage, a second input coupled to an inverted output of the intermediate latch stage, and a third input coupled to receive a logic high carry in value, wherein the adder stage is coupled to generate an output representative of a difference between the output of the GC to binary stage and a binary representation of a phase-aligned GC output latched in the intermediate latch stage, wherein the difference between the output of the GC to binary stage and the binary representation of the phase-aligned GC output latched in the intermediate latch stage is the CDS representation of the respective digital image data signal; and
an ALU output coupled to an output of the adder stage.

35. The imaging system of claim 34, wherein the each one of the plurality of ALUs further comprises a pulse generator coupled to generate a front end latch enable signal in response to the respective comparator, wherein the front end latch stage is coupled to latch the phase-aligned GC outputs in response to the front end latch enable signal.

36. The imaging system of claim 35, wherein the each one of the plurality of ALUs further comprises a data latch stage coupled between the adder stage and the ALU output, wherein the data latch stage is coupled to latch the output of the adder stage in response to a data latch enable signal.

37. The imaging system of claim 36, wherein the each one of the plurality of ALUs further comprises bypass switch coupled between an input of the pulse generator and an output of the pulse generator, wherein the front end latch enable signal is substantially equal to an output of the respective comparator when the bypass switch is closed, wherein the front end latch enable signal is substantially equal to an output of the pulse generator when the bypass switch is opened.

38. The imaging system of claim 37, wherein the each one of the plurality of ALUs further comprises a gating stage coupled between the front end latch stage and the GC to binary stage, wherein the gating stage is configured to couple an input of the GC to binary stage to an output of the front end latch stage in response to the data latch enable signal or the intermediate latch enable signal.

39. The imaging system of claim 38, wherein the gating stage comprises an OR gate having a first input coupled to receive the intermediate latch enable signal and a second input coupled to receive the data latch enable signal, wherein the gating stage is configured to couple an input of the GC to binary stage to an output of the front end latch stage in response to an output of the OR gate.

40. The imaging system of claim 39, wherein the gating stage further comprises a plurality of AND gates, wherein each one of the plurality of AND gates has a first input coupled to an output of a respective one of a plurality of latches of the front end latch stage, wherein each one of the plurality of AND gates has a second input coupled to the output of the OR gate, and wherein each one of the plurality of AND gates has an output coupled to the input of the GC to binary stage.

41. The imaging system of claim 39, wherein the gating stage further comprises a plurality of gating latches, wherein each one of the plurality of gating latches has a data input coupled to an output of a respective one of a plurality of latches of the front end latch stage, wherein each one of the plurality of gating latches has a clock input coupled to the output of the OR gate, and wherein each one of the plurality of gating latches has an output coupled to the input of the GC to binary stage.

* * * * *

UNITED STATES PATENT AND TRADEMARK OFFICE
CERTIFICATE OF CORRECTION

PATENT NO. : 11,431,936 B2
APPLICATION NO. : 16/854765
DATED : August 30, 2022
INVENTOR(S) : Lihang Fan et al.

It is certified that error appears in the above-identified patent and that said Letters Patent is hereby corrected as shown below:

In the Claims

In Column 24, Line 7, delete "in response to in response to" and insert -- in response to --, therefor.

In Column 24, Line 30, delete "in response to in response to" and insert -- in response to --, therefor.

In Column 25, Line 22, delete "comparator," and insert -- comparator output, --, therefor.

In Column 27, Line 35, delete "in response to in response to" and insert -- in response to --, therefor.

In Column 27, Line 57, delete "in response to in response to" and insert -- in response to --, therefor.

Signed and Sealed this
Eighteenth Day of April, 2023

Katherine Kelly Vidal
*Director of the United States Patent and Trademark Office*